(12) United States Patent
Ishii et al.

(10) Patent No.: US 6,576,943 B1
(45) Date of Patent: Jun. 10, 2003

(54) SEMICONDUCTOR DEVICE FOR REDUCING LEAK CURRENTS AND CONTROLLING A THRESHOLD VOLTAGE AND USING A THIN CHANNEL STRUCTURE

(75) Inventors: Tomoyuki Ishii, Hachioji (JP); Kazuo Yano, Hino (JP); Toshiyuki Mine, Fussa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/512,827

(22) Filed: Feb. 25, 2000

(30) Foreign Application Priority Data

Mar. 17, 1999 (JP) .......................................... 11-071402

(51) Int. Cl.$^7$ ........................................... H01L 27/108
(52) U.S. Cl. ...................... 257/296; 257/309; 257/316
(58) Field of Search ................. 257/296, 302, 257/304, 311, 318, 315–316, 327, 329, 330, 410–411, 903; 365/186.1, 186.17, 186.27

(56) References Cited

U.S. PATENT DOCUMENTS

| 4,771,323 A | * | 9/1988 | Sasaki | 257/69 |
| 5,023,683 A | * | 6/1991 | Yamada | 257/309 |
| 5,589,699 A | * | 12/1996 | Araki | 257/316 |
| 6,246,083 B1 | * | 6/2001 | Noble | 257/296 |

FOREIGN PATENT DOCUMENTS

WO    WO 9531828 A1 * 11/1995

OTHER PUBLICATIONS

"Extended Abstracts, 16th Conference on Solid Devices and Materials," 1984, pp. 265–268, H. Shichijo et al.
IEEE International Electron Devices Meeting, pp. 1006–1008, 1992, S. Shukuri, et al.
IEEE International Electron Devices Meeting, 1993, pp. 541–544, K. Yano, et al..
IEEE International Solid–State Circuits Conference, 1996, pp. 266–267, K. Yano et al.

* cited by examiner

Primary Examiner—Minh Loan Tran
Assistant Examiner—Thomas L Dickey

(57) ABSTRACT

A very thin semiconductor film is used for channels of semiconductor memory elements such that leak currents are reduced by the quantum-mechanical containment effect in the direction of film thickness. The amount of electrical charge accumulated in each charge accumulating region is used to change the conductance between a source region and a drain region of each read transistor structure. This conductance change is utilized for data storage. The thickness of the channel of the write transistor structure is preferably no more than 5 nm. According to one embodiment, the channel of the write transistor is formed by a semiconductor film deposited on a surface intersecting a principal plane of the substrate.

28 Claims, 27 Drawing Sheets

SEMICONDUCTOR DEVICE FOR REDUCING LEAK CURRENTS AND CONTROLLING A THRESHOLD VOLTAGE AND USING A THIN CHANNEL STRUCTURE

BACKGROUND OF THE INVENTION

1. Field of the Invention

The present invention relates to a semiconductor element and a semiconductor device.

2. Description of the Related Art

MOSFETs (metal-oxide-semiconductor field effect transistors) are normally placed in an off-state to prevent currents from leaking by means of pn junctions. The primary causes of leak currents include subthreshold currents and reversed carrier recombination. Such currents are small but not negligible; they determine the data holding time of DRAMs (dynamic random access memories) and define their refresh cycles. Schemes proposed so far to minimize leak currents include the reduction of crystal defects with wafers subject to epitaxial growth, and complete depletion in the off-state by use of SOI (silicon on insulator) wafers.

There has been proposed a memory element structure called gain cells capable of operating as DRAM cells with reduced stored charges. The proposed structure involves electrically charging a memory node via a write transistor so that the stored charge in the node causes a separately provided read transistor to vary its threshold voltage, which represents a piece of data stored. Related conventional techniques include a structure using polycrystal silicon for write transistors as disclosed by H. Shichijo et al., Conference on Solid State Device and Materials, pp. 265–268, 1984; and a structure using polycrystal silicon for read transistors as proposed by S. Shukuri et al., IEEE International Electron Devices Meeting, pp. 1006–1008, 1992.

Other conventional techniques related to this invention include a single electronic memory utilizing polycrystal silicon as depicted by K. Yano et al., IEEE International Electron Devices Meeting, pp. 541–544, 1993, as well as by Ishii et at., IEEE International Solid-State Circuits Conferences, pp. 266–267, 1996. In the proposed electronic memory, polycrystal silicon thin films are used concurrently to form channels as current paths and storage regions for capturing electrons. A piece of data is retained when electrons captured by a storage region change the latter's threshold voltage. What characterizes this technique is that a few electrons are enough to store one bit of data. Electrons are injected into a given storage region by applying a voltage of 12 V through 15 V to a gate electrode. To discharge the stored electrons requires applying a voltage of −10 V through −15 V to the gate electrode. The use of polycrystal silicon grains permits formation of a structure effectively smaller than the fabricated size. Memory elements in this structure are capable of operating at room temperature. A single transistor constitutes each memory element.

One of the guides to MOSFET micro-fabrication is the scaling law. According to this principle, reduction of the size to 1/K requires multiplying the substrate density by a factor of K. However, raising the substrate density narrows the depletion layer width and increases leaks from junctions. A solution to this problem involves the use of an SOI substrate for a complete depletion in the off-state. In that case, leak currents sill flow illustratively because of the reversed carrier recombination, although the currents are smaller than in ordinary substrates. At very advanced levels of micro-fabrication, uneven positions of impurities in channels can trigger the flow of leak currents. Efforts to design for a high threshold voltage can be defeated by a current path being formed at a voltage lower than the threshold voltage due to the uneven presence of impurities, with the current path condoning a flow of leak currents.

Ever-finer structures of memory cells in DRAMs, flash memories and other types of memories have translated into smaller memory cell areas than ever before. The trend has made it possible to implement ever-greater memory capacities. In particular, DRAMs with one transistor and one capacitor making up their basic structure have gained widespread acceptance as a memory device offering both high-speed performance and high degrees of integration. The growing scale of memories, however, requires longer refresh cycles. The trend thus presents a need for a low-leak FET structure. For the DRAMs, a simple-minded drive for more advanced micro-fabrication aimed at smaller memory cell areas entails narrowing areas of capacitors, reducing capacitance values of the capacitors and lowering their stored charges. Meanwhile, data lines are generally extended as the memory size increases. Since the data lines are subject to charging and discharging operations and should also be resistant to noise, the amount of stored charges cannot be too low. Hence the problem of having to devise for each new generation of DRAMs a novel scheme for building a three-dimensional capacitor structure or for enhancing the dielectric constant of capacitor insulating films.

One solution to the above problem is not directly to charge or discharge the data lines using cumulative charges but to accumulate electrical charges near transistor channels so as to vary the threshold voltage of transistors for data storage. Because the solution allows the data lines to be charged and discharged using drain currents of transistors, the problem above is bypassed and memory elements are easily reduced in size. The conventional three-transistor type DRAM has been proposed on the basis of the solution above. The three-transistor type DRAM needs to make its refresh cycle shorter than before because its amount of cumulative charges is smaller than in ordinary DRAMs. The refresh cycle is required to be shortened progressively the higher the degree of integration. This, it can be expected, will eventually result in another problem.

The EEPROM and flash memory are other memory elements that have electrical charges stored in the vicinity of transistor channels to vary the transistor threshold voltage for data retention. In operation, a high voltage is applied to a tunnel insulating film in order to inject electrons or holes into a floating gate. One disadvantage of this type of memory is that it takes time to write or read data because currents are made to flow through the insulating films. Since the operating voltage is high, it is necessary to prepare peripheral circuits of high dielectric strengths. Such peripheral circuits tend to occupy wider areas. In order to ensure reliable data retention under high-voltage application, the tunnel insulating film must at least have a thickness of a little less than 10 nm. That means the tunnel insulating film cannot be made thinner than that size while the elements are being scaled down, so that the short channel effect is getting more and more pronounced. Furthermore, the amount of currents flowing through tunnels varies considerably depending on the insulating film thickness and on the presence or absence of traps. This leads to significant variations in characteristics between memory elements.

It is therefore an object of the present invention to provide a semiconductor element operating on a threshold voltage controlling method not resorting to low leaks or to impurity injection; a scaled-down semiconductor memory device which uses such semiconductor elements and is capable of ensuring a sufficiently long refresh cycle for high-speed write operations; and a semiconductor device comprising such elements.

SUMMARY OF THE INVENTION

The invention envisages reducing leak currents and controlling a threshold voltage by taking advantage of the quantum-mechanical containment effect brought about in the direction of film thickness by use of a very thin semiconductor structure for channels.

In carrying out the invention, there is typically provided a semiconductor element comprising a transistor structure having a source region 200; see FIG. 23, a drain region 201, a channel region 202 for connecting the source region 200 and the drain region 201, and a control electrode 203 for controlling conductance of the channel region 202, wherein an average thickness of the channel region 202 is 5 nm at most. This semiconductor element is typically constituted as shown in FIG. 23 but is not limited thereby.

In carrying out the invention, there is also provided a semiconductor memory element wherein conductance between the source and drain of a read transistor is varied depending on the amount of stored electrical charges, the conductance variation being used to retain a piece of data, and wherein a channel of a transistor for electrically charging or discharging a charge accumulating region is made of a semiconductor 5 nm or less in thickness. This structure enables both high-speed data write performance and prolonged data retention. The thickness of transistor channels may be minimized as desired so long as film defects do not become apparent during fabrication processes.

In carrying out the invention, there is also provided a semiconductor element comprising: a read transistor structure made of a source region 7; see FIG. 1, a drain region 8, a semiconductor region 6 for interconnecting the source region 7 and the drain region 8, and a control electrode 5 for controlling conductance of the semiconductor region 6; a charge accumulating region 1 located near the semiconductor region 6 for interconnecting the source region 7 and the drain region 8; and a write transistor structure 1, 2, 3, 5 for either electrically charging or electrically discharging the charge accumulating region 1; wherein an amount of electrical charges stored in the charge accumulating region 1 changes conductance between the source region 7 and the drain region 8 in the read transistor structure, the conductance change being used for data storage; and wherein a channel of the write transistor structure is made of a semiconductor 5 nm at most in average thickness. This semiconductor element is typically constituted as shown in FIG. 1 but is not limited thereby.

The electrical conductivity of low-dimensional systems was heretofore discussed with a view to improving system mobility but was never talked about in terms of reducing leak currents in the off-state. To the inventors of this invention, it was not clear at the outset that with such a thin semiconductor film, the leak currents could be made smaller. To prove that the leak currents were actually reduced, the inventors experimentally fabricated semiconductor transistors, one of which is shown in FIGS. 20A and 20B. FIG. 20A is a cross-sectional view of the semiconductor transistor, and FIG. 20B is a top view of the same transistor. The experimentally fabricated transistor included a source region 103, a drain region 105 and a control electrode 106 made of n-type polycrystal silicon. A channel 104 in the semiconductor was a non-doped polycrystal silicon film with an average thickness of 3 nm. The channel was deposited in an amorphous state and crystallized later by a heating process. The channel thin line was 0.1 micron wide and 0.3 microns long, and the thickness of a gate oxide film in the transistor was 25 nm. FIG. 21A shows how a drain current varied when a drain voltage of the experimental semiconductor transistor was fixed to 1 V and its gate voltage was changed. FIG. 21B depicts how the drain current of the transistor varied over time when the drain voltage was fixed to 1 V and the gate voltage was fixed to −0.5 V. Currents were measured by use of the HP4156 Parameter Analyzer available from Hewlett-Packard Co., and measurements were taken in the "long" measurement mode at room temperature. The measuring increment of the analyzer was 10 fA, and the measurements fluctuated between 0 and −10 fA. In view of the behavior of the current values, the fluctuating measurements were judged to represent not true currents but ambient noise. In other words, the leak currents were less than 10 fA. Further comparisons were made of leak currents between transistors fabricated experimentally with their average channel thickness varied from 3 nm to 5 nm to 8 nm. On transistors of each channel thickness, leak currents were measured when the drain voltage was set for 1 V and the gate voltage was set to be 1.5 V lower than a threshold voltage Vth for a drain current of 1 pA. Six transistors of each film thickness type were measured for leak currents, and the measurements were averaged and illustrated graphically in FIG. 39. As shown in FIG. 39, most measurements came below the measurable limit for the film thicknesses of 3 nm and 5 nm, while leak currents became measurable for the film thickness of 8 nm, rising by one order of magnitude. The results indicate that the film thickness is preferably less than 8 nm. Unlike the well-known single electronic memory constituted by polycrystal silicon, the experimentally fabricated transistors operated on a voltage as low as ±3 V or less. Whereas relatively thick gate oxide films (25 nm thick each) were used in the experiments, smaller operating voltages permit the use of a thinner film in view of dielectric strength. In such a case, the transistors can operate on a still lower voltage than ever. These preliminary considerations undertaken by the inventors formed a basis for conceiving this invention.

The invention also proposes a novel gain cell structure comprising: a substrate; a read transistor having a source region and a drain region formed illustratively as diffusion regions in the substrate, and a channel region for interconnecting the source region and the drain region; a charge accumulating region located near the channel region; and a write transistor for either electrically charging or electrically discharging the charge accumulating region; wherein at least part of a channel of the write transistor is formed by a semiconductor film deposited on a surface intersecting a principal plane (the widest surface) of the substrate.

In the gain cell structure above, the write transistor can be constituted without recourse to a diffusion layer. In a preferred structure, the semiconductor film is arranged to have an average thickness of 8 nm or less and more preferably under 5 nm when deposited on a side of a construct formed in a convex fashion on the principal plane of the substrate. A minimum film thickness may be determined as desired so long as film defects do not become apparent. Advantageous characteristics are available when the film thickness is 3 nm. The side of the construct is illustratively perpendicular to the principal plane of the substrate. The construct may double as a control electrode for the channel. The source and drain regions of the write transistor may be formed by films stacked on the principal plane of the substrate. In this structure, the current flowing through the channel of the write transistor passes along the surface of the semiconductor film constituting the channel and in an approximately perpendicular relation to the principal plane of the substrate.

In carrying out the invention, there is also provided a semiconductor memory element comprising: a substrate; a read transistor having a source region and a drain region formed in the substrate, and a channel region for interconnecting the source region and the drain region; a charge accumulating region located near the channel region; and a write transistor for either electrically charging or electrically discharging the charge accumulating region; wherein a source region, a drain region and a channel of the write transistor are formed by films deposited on a principal plane of the substrate, the source region and the drain region being spaced apart horizontally over the principal plane of the substrate. With this structure, the film making up the channel of the write transistor is constituted by a semiconductor preferably 8 nm or less and more preferably under 5 nm in average thickness. A minimum film thickness may be determined as desired so long as film defects do not become apparent. Advantageous characteristics are available when the film thickness is 3 nm. Preferably, the films constituting the source and drain regions of the write transistor are each arranged to be thicker than the film making up the channel of the write transistor. In such a constitution, the current flowing through the channel of the write transistor passes along the surface of the semiconductor film constituting the channel and in an approximately perpendicular relation to the principal plane of the substrate.

Other objects, features and advantages of the invention will become more apparent upon a reading of the following description and appended drawings.

BRIEF DESCRIPTION OF THE DRAWINGS

Preferred embodiments of the present invention will be described in detail with reference to the following figures wherein.

DETAILED DESCRIPTION OF THE PREFERRED EMBODIMENTS

First Embodiment

Figure 23:
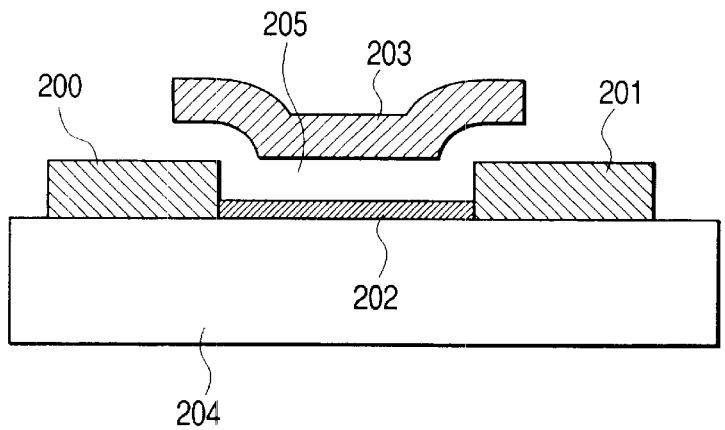
FIG. 23 is a cross-sectional view of a semiconductor element practiced as a first embodiment of the invention.

Semiconductor elements and semiconductor devices specifically embodying the invention are described below. FIG. 23 is a cross-sectional view of a semiconductor element practiced as the first embodiment of the invention. Using an SOI substrate, the semiconductor element includes a source region 300, a drain region 201 and a channel 202 made of single crystal and deposited on an $SiO_2$ film 204. The source 200 and drain 201 are n-type regions of high impurity density. The channel 202 is a p-type channel 4 nm in average thickness, thinner than the source 200 or drain 201 region. A control electrode 203 is constituted by n-type polycrystal silicon of high impurity density. The channel 202 is isolated from the control electrode 203 by a gate insulating film 205 composed of an $SiO_2$ film.

Figure 25A:
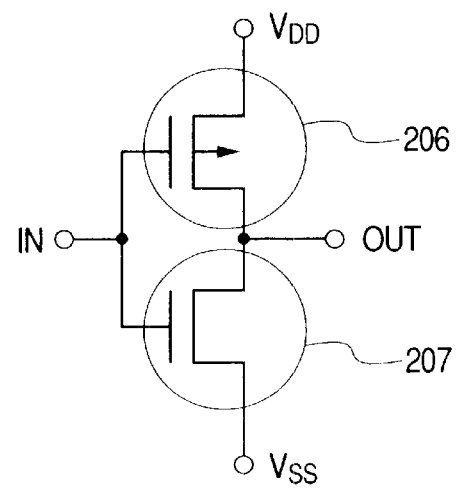
FIG. 25A is a circuit diagram of an inverter circuit contained in a semiconductor device comprising semiconductor elements of the first embodiment.
Figure 25B:
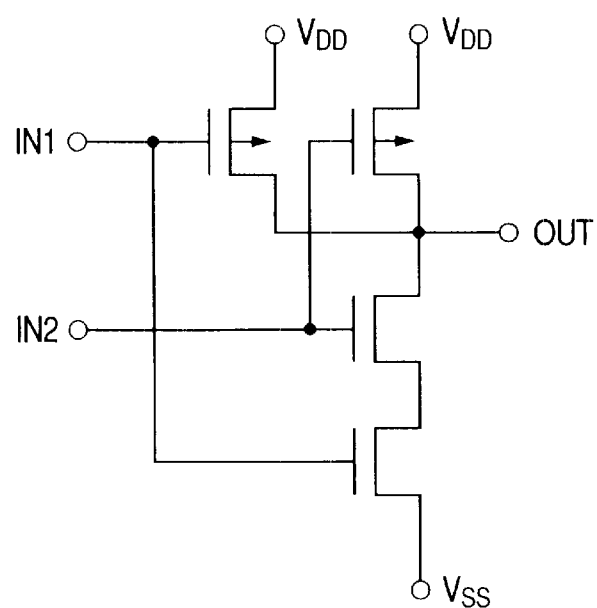
FIG. 25B is a circuit diagram of a NAND circuit included in the semiconductor device comprising semiconductor elements of the first embodiment.

The first embodiment is the same as the common n-channel MOS in that application of a positive voltage to the control electrode 203 turns on the transistor to permit a current flow between the source 200 and the drain 201. The first embodiment is equivalent to a semiconductor element made of an SOI substrate with a thicker channel film in that the channel 202 is completely depleted in the off-state. What characterizes the first embodiment is an extended band gap brought about by the quantum-mechanical containment effect through the thin film of the channel 202. This makes it possible to reduce leak currents to an extent greater than through the complete depletion. Furthermore, a suitable selection of the film thickness allows the threshold voltage to be controlled independently of the impurity density in the channel. Because the beneficial effect of the channel being made of a very thin film is uniformly felt all over the channel, any leak path that may derive from uneven presence of impurities in the thin channel is prevented from occurring. A p-channel transistor may be implemented in a similar structure wherein the source and drain are p-type regions while the channel is an n-type channel. The control electrode may remain the same n-type or may be replaced by a p-type electrode. A non-doped channel may be used alternatively to control the threshold voltage in terms of film thickness. It should be noted that the resistance becomes higher the thinner the film. These n- and p-channel transistors may be combined suitably to form a CMOS circuit. FIG. 25A is a circuit diagram of an inverter circuit based on the first embodiment. This configuration combines a p-channel transistor 206 with an n-channel transistor 207. A High and a Low input turn off the p-channel transistor 206 and the n-channel transistor 207 respectively to minimize any punch-through current; the resulting leak current translates conversely into a punch-through current. With the first embodiment, the reduced leak current helps reduce power dissipation. FIG. 25B is a circuit diagram of a NAND circuit based on the first embodiment. The punch-through current of this configuration is also reduced in like manner, and the same applies to other CMOS circuits.

Figure 24:
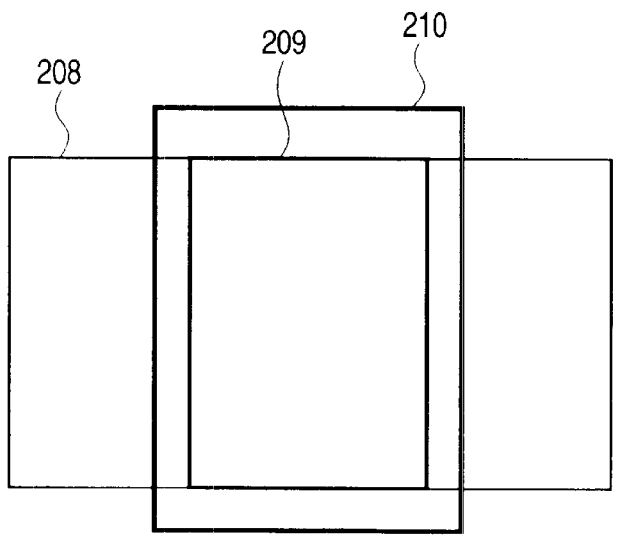
FIG. 24 is a mask pattern for fabricating semiconductor elements of the first embodiment.

Below is a description of how the first embodiment is fabricated. FIG. 24 is a mask pattern used in lithography to fabricate semiconductor elements of the first embodiment. A thin film SOI substrate is first used to dry-etch the silicon around an active region 208 with a photo-resist used as a mask. The resulting grooves surrounding the active region are filled with an insulating film to achieve flatness. With the silicon surface subjected to sacrificial oxidation, an $Si_3N_4$ film is deposited. The $Si_3N_4$ film is dry-etched using a photo-resist as a mask in order to remove the $Si_3N_4$ film from a channel region 209. An ensuing oxidation process oxidizes only those portions where the $Si_3N_4$ film pattern is absent. Then with the $Si_3N_4$ film removed, arsenic (As) or phosphorus (P) ions are implanted to produce an n-type source region 200 and an n-type drain region 201. At this point, the source and drain regions of the p-channel transistor are covered with a resist. After the source and drain regions of the n-channel transistor are covered with a resist, boron (B) ions are implanted to bring about a p-type source region and a p-type drain region for the p-channel transistor. The channel portion at this point is covered with an oxide film and is thus impervious to the implantation of impurities.

The oxide film is thereafter wet-etched, whereby the channel portion 202 is made into a thin film. After the surface is subjected to sacrificial oxidation and after the active region of the p-channel transistor is covered with a resist, boron (B) ions are implanted to adjust the impurity density in the channel of the n-channel transistor. Likewise, after the active region of the n-channel transistor is covered with a resist, arsenic (As) ions are implanted to adjust the impurity density in the channel of the p-channel transistor. With the sacrificial oxide film removed, an oxidation process is carried out to form a gate insulating film 205. Furthermore, n-type polycrystal silicon is deposited and dry etching is carried out with a resist pattern 210 used as a mask to form a control electrode 203. An $SiO_2$ film is then deposited to achieve flatness, followed by contact and wiring processes. Alternatively, non-doped polycrystal silicon may be deposited to form the control electrode portions, and a different type of impurities may be introduced into the control electrodes of n- and p-channel transistors with a resist used as a mask. As another alternative, a thin silicon film of a uniform thickness may be prepared in advance; and silicon, another semiconductor, silicide or metal may be stacked over the source and drain regions to reduce resistance. Since the film for channel formation may have the same thickness over the entire surface of the wafer, it is easy to monitor the channel film thickness during fabrication.

Second Embodiment

Figure 26A:
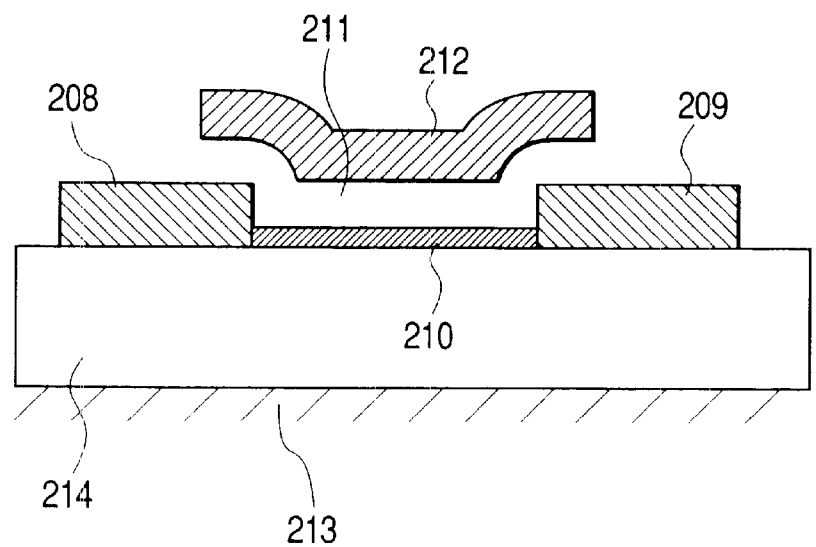
FIG. 26A is a cross-sectional view of a semiconductor element practiced as a second embodiment of the invention.
Figure 26B:
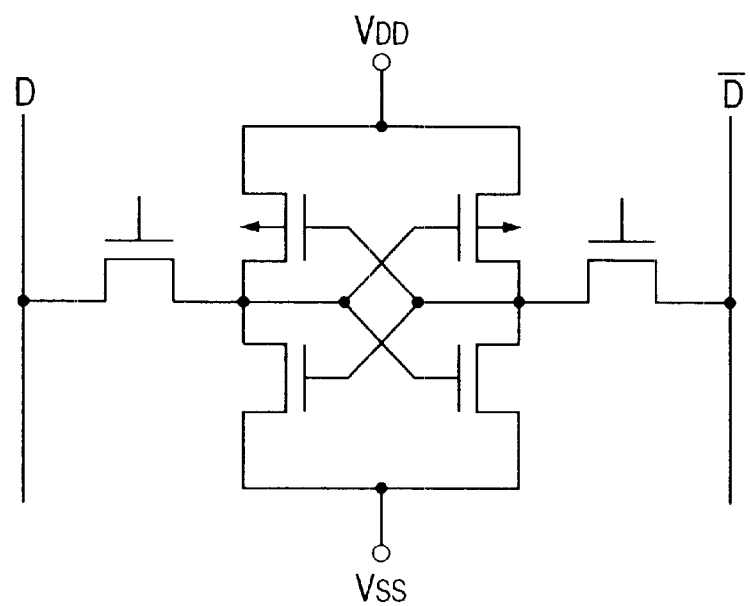
FIG. 26B is a circuit diagram of a semiconductor device comprising semiconductor elements of the second embodiment.

FIGS. 26A and 26B show a semiconductor element practiced as the second embodiment of the invention. FIG. 26A is a cross-sectional view of the semiconductor element. Unlike the first embodiment that had the source 200, drain 201 and channel 202 formed on the SOI substrate surface, the second embodiment has a source 208, a drain 209 and a channel 210 formed by polycrystal silicon deposited on an $SiO_2$ layer 214. The source 208 and drain 209 are n-type regions of high impurity density. The channel 210 is made of a non-doped polycrystal silicon film 3 nm in average thickness. The channel portion is deposited in an amorphous state and crystallized later by a heating process. As opposed to the first embodiment in which a thicker silicon film was thinned down to form the channel, the second embodiment need only have a thin film deposited for channel formation and thus entails simpler fabrication processes. The second embodiment is equivalent to the first embodiment in that all channels are depleted in the off-state and that the potential in the film is raised by the quantum-mechanical containment energy in the direction of film thickness due to a very small film thickness. Furthermore, because the potential in the thin film region varies significantly even with slight film thickness changes, the potential distribution within the film is altered not uniformly but randomly. As a result, a plurality of low-potential portions in the film in the nonconductive state are disconnected by high-potential regions. In addition, grain boundaries of polycrystal films act as potential barriers. On the other hand, it should be noted that grain boundaries can let leak currents pass through. Circuits may be formed using the surface of a silicon substrate 213. It is also possible for transistors on the substrate surface and transistors of the second embodiment to be positioned in vertically stacked relation. Such a stacked makeup helps reduce the chip area. The silicon substrate 213 may be an SOI substrate. Transistors of the first embodiment may be formed on the surface of an SOI substrate for use in combination with elements of the second embodiment. In the same structure as that of n-channel transistors, changing the type of impurities implements p-channel transistors as well. These elements may be used to constitute an SRAM (static random access memory) whose circuit diagram is shown in FIG. 26B. Because the transistors are of a low-leak type, the punch-through current of memory cells is reduced and so is power dissipation. The other effects of the second embodiment are the same as those of the first embodiment. In transistors utilizing the surface of an SOI substrate in the first embodiment, the source and drain regions may be formed by single crystal silicon and the channel portions by polycrystal silicon as in the second embodiment. In such a case, the silicon of the channel portions is removed during fabrication while the source and drain regions are left intact, before a thin film is again deposited for channel formation. The processes involved are simpler and better suited to control channel film thickness than the processes of the first embodiment whereby the thicker film was thinned down.

Third Embodiment

Figure 27A:
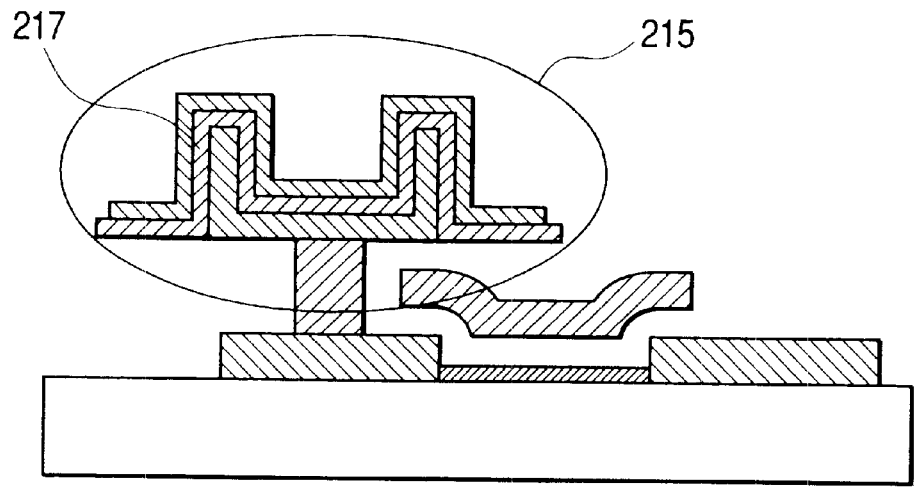
FIG. 27A is a cross-sectional view of a memory cell structure of a semiconductor memory device practiced as a third embodiment of the invention.
Figure 27B:
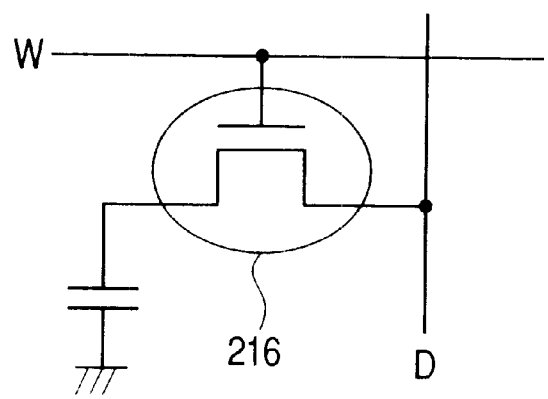
FIG. 27B is a circuit diagram of the semiconductor memory device as the third embodiment.

FIGS. 27A and 27B depict a memory cell structure of a semiconductor memory device practiced as the third embodiment of the invention. FIGS. 27A and 27B are a cross-sectional view and a circuit diagram of the memory cell structure respectively. The transistor of the first embodiment is used as a switching transistor 216 of a DRAM as the third embodiment. Generally, the DRAM retains data by accumulating electrical charges in each of its capacitors 215. The charges gradually dissipate in the form of leak currents through the switching transistor. To hold its data, today's common DRAM has its charges refreshed in cycles of slightly less than one second. The third embodiment affords a prolonged refresh cycle because of reduced leak currents through transistors. That in turn lowers the refresh frequency and decreases power dissipation for data retention. At the same time, the frequency of contention between access and refresh operations is also lowered, which reduces the average access time. Although the third embodiment has its capacitors 215 built in a three-dimensional structure for enhanced capacity, other suitable structures may be adopted instead. A material of a high dielectric constant may be used to form a capacitor insulating film 217.

Fourth Embodiment

Figure 1:
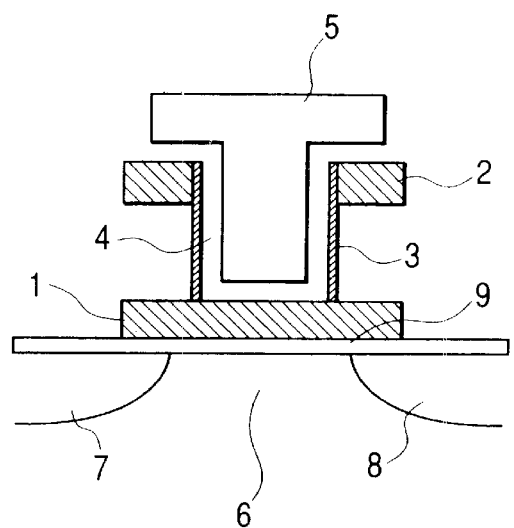
FIG. 1 is a cross-sectional view of a semiconductor memory element practiced as a fourth embodiment of this invention.

FIGS. 1 through 6 show the fourth embodiment of this invention. FIG. 1 is a cross-sectional view of a semiconductor memory element practiced as the fourth embodiment of the invention. In the memory element, a source 1, a drain 2 and a control electrode 5 of a write transistor are made of n-type polycrystal silicon of high impurity density. A channel 3 is constituted by a non-doped polycrystal silicon film 3 nm in average thickness. The channel 3 is isolated from the control electrode 5 by a gate insulating film 4 made of an $SiO_2$ film. The source 1 of the write transistor doubles as a charge accumulating region. A source 7 and a drain 8 of a read transistor are n-type regions of high impurity density formed in a p-type silicon substrate. The control electrode 5 of the read transistor, shared by the write transistor, forms a channel path by controlling potential on the substrate surface through capacitive coupling via the charge accumulating region 1. While the names "source" and "drain" are used to refer to the specific regions in the fourth embodiment, these names may be switched in the case of the write transistor because the latter is a path transistor. Whereas in the fourth and subsequent embodiments, the diffusion layer structure is adopted as the simplest of structures for simplifying fabrication processes, this is not limitative of the invention. Alternatively, more complicated structures may be used to provide against the short channel effect.

In the fourth and subsequent embodiments, electrons are used as carriers. However, this is not limitative of the invention, and positive holes may be used instead as carriers. Where carriers are positive holes, the relations in magnitude between different voltages and the directions of currents are altered.

What follows is a description of how the memory element of the fourth embodiment works. A write operation to the element is performed by bringing the drain 2 of the write transistor High or Low according to the piece of data to be written thereto and by changing the potential of the control electrode 5 to put the write transistor in the conductive state. The number of electrons found in the charge accumulating region 1 when the drain 2 is set for the High level is smaller than when the drain 2 is set for the Low level. Because the transistor is used to inject or discharge electrons to or from each charge accumulating region, the applied voltage is arranged to be lower in the fourth embodiment than in EEPROMs or flash memories. The configuration also permits high-speed write and delete operations of data. Stored electrons are retained by lowering the potential of the control electrode 5 and by putting the write transistor in the nonconductive state. At this point, the channel made of a very thin semiconductor film surrounded by an insulating film is completely depleted. The potential in the film is raised by the quantum-mechanical containment energy in the direction of film thickness due to the reduced film thickness.

Furthermore, because the potential in the thin film region varies appreciably even with slight film thickness changes, the potential distribution within the film is altered not uniformly but randomly. As a result, a plurality of low-potential portions in the film in the nonconductive state are disconnected by high-potential regions. In addition, grain boundaries of polycrystal films act as potential barriers. For these reasons, the memory element of the fourth embodiment has less leak currents in the write transistor for better data retention than in the simple SOI (silicon on insulator) structure wherein only the complete depletion is taken advantage of for the same purpose. This particular effect becomes apparent where the silicon channel thickness is reduced to 5 nm or less. The effect is derived conceivably from the fact that film thickness variations entail thinner portions about 3 nm in thickness, bringing the level of the potential barrier by the containment energy to as high as the level of the thermal energy at room tmperature. In practice, a particularly pronounced effect was observed when the film thickness was set for about 3 nm. As discussed earlier in the summary of the invention, the effect of reduced leak curents was confirmed experimentally when the film thickness was 5 nm or less. This is a phenomenon brought to light for the first time by the inventors of this invention. Heretofore, TFTs (thin film transistors) based on polycrystal silicon were thought to have large leak currents. Different numbers of electrons in the charge accumulating region 1, it was observed, correspond to different threshold voltages of the read transistor. Thus a piece of data held by a memory element is read out by detecting the magnitude of the current flowing through the read transistor under a predetermined voltage condition. Unlike DRAMs, the fourth embodiment has a data item retrieved from each memory element not in terms of stored charges but in the form of drain currents through the read transistor. As a result, the reduced element dimensions do not lead to an appreciably lowered amount of signal in each element. This renders the fourth embodiment conducive to scaling down the device size. In the fourth embodiment, each read transistor and the paired write transistor share a control electrode. For that reason, the pontential of the control elecdtrode 5 for a read operation is set to be lower than the potential for a write operation. As a read condition, the threshold voltage of the write transistor needs to be set to a sufficiently high level so that the retained charges are held at least for a predetermined period of time. With the fourth embodiment, the potential of the control electrode 5 is set for 5 V to write data and for 2 V to read data. After the read operation, the data in question may be refreshed as needed since part of the stored charges may have been lost during the reading depending on the threshold voltage established. The fourth embodiment of the invention is thus conducive to desired scaling and permits designing of greater capacity and longer data retention time the higher the level of micro-fabrication. As such, the fourth embodiment is applicable not only to main memories but also to memory chips for recording sound, still pictures and moving pictures. It is also possible to integrate logic functions and semiconductor memory devices as the fourth embodiment on the same wafer in order to boost data transfer speeds and to reduce fabrication costs. In that case, unlike conventional wafer makeups that mix CMOSs and DRAMs, the inventive configuration requires no new material for fabricating capacitor insulating films or electrodes of memory elements. This simplifies the fabrication processes involved.

Figure 2:
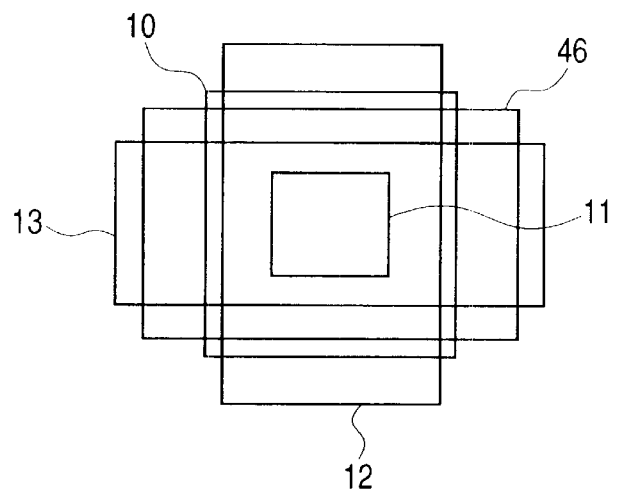
FIG. 2 is a schematic view of a mask pattern for fabricating semiconductor memory elements of the fourth embodiment.

Described below are typical processes for fabricating the fourth embodiment. FIG. 2 is a schematic view of a mask pattern used in lithography to fabricate semiconductor memory elements of the fourth embodiment. Etching is first performed with a photo-resist used as a mask 46. The resulting grooves are filled with insulators to prepare an active region surrounded by the mask pattern 46 on the surface of a P-type substrate 6. The substrate may alternatively be an SOI substrate. The surface is oxidized to form a gate insulating film 9 of a read transistor 7 nm thick. An n-type polycrystal silicon film is then deposited and subjected to etching with a photo-resist used as a mask 10, whereby a charge accumulating region 1 is formed. With the charge accumulating region 1 used as a mask, arsenic (As) or phosphorus (P) ions are implanted to form a source 7 and a drain 8 of the read transistor. After the implanted ions are activated by a heating process, an $SiO_2$ film is deposited, followed by depositing of an n-type polycrystal silicon film. Then an EB (electron beam) resist is used as a mask to form holes each penetrating the polycrystal silicon film of the drain 2 as well as the $SiO_2$ film to reach the charge accumulating region 1. Although square holes are adopted by the fourth embodiment, any other hole shape may be used instead. Even where the mask pattern is arranged to be square or rectangular, the resist pattern has its corners more or less rounded. That means the actual hole pattern tends to be cylindrical or oval-shaped. An amorphous silicon film 3 nm in thickness and an $SiO_2$ film 10 nm thick are further deposited and subjected to annealing, whereby the amorphous silicon is crystallized. With a photo-resist used as a mask 12, the $SiO_2$ film and polycrystal silicon film are etched to form the drain 2 of each write transistor. An $SiO_2$ film 5 nm thick is then deposited as a gate insulating film 4, followed by depositing of an n-type polycrystal silicon film. With a photo-resist used as a mask 13, the polycrystal silicon film is etched to form the control electrodes 5. The thickness of the gate insulating film 4 for the write transistor, 12 nm in this example, is obtained by subtracting the amount of wear in a washing process from the sum of the two $SiO_2$ films stacked following the depositing of the amorphous silicon. In the known single electron memory utilizing polycrystal silicon, the gate insulating film generally has a thickness of 25 nm to ensure a sufficient dielectric strength in the face of 15 V or higher voltages resulting from write and delete operations. Because the fourth embodiment permits low-voltage operations, a thinner gate insulating film arrangement may be used to enhance transistor performance.

Figure 3:
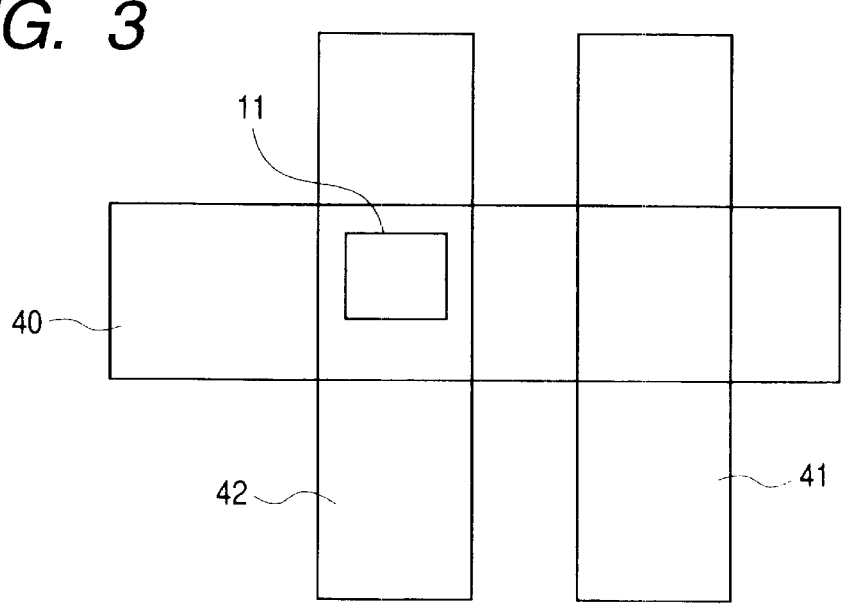
FIG. 3 is a schematic view of a wiring pattern for constituting a memory cell array comprising semiconductor memory elements of the fourth embodiment.
Figure 4A:
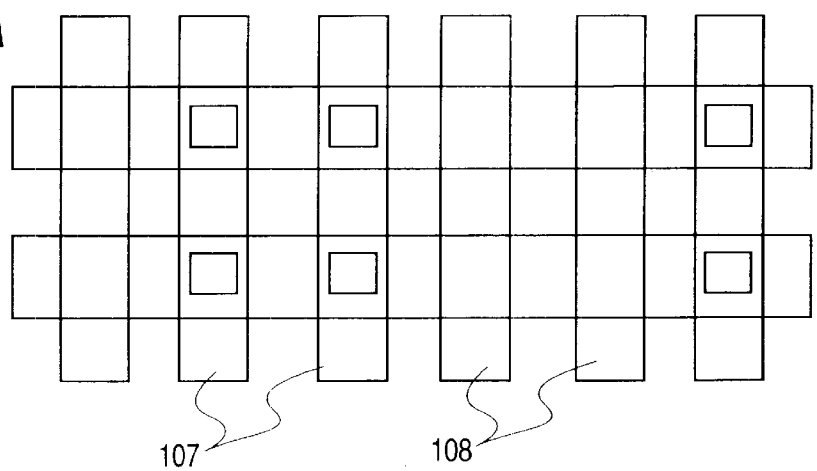
FIGS. 4A and 4B are schematic views of array structures comprising semiconductor memory elements of the fourth embodiment.
Figure 4B:
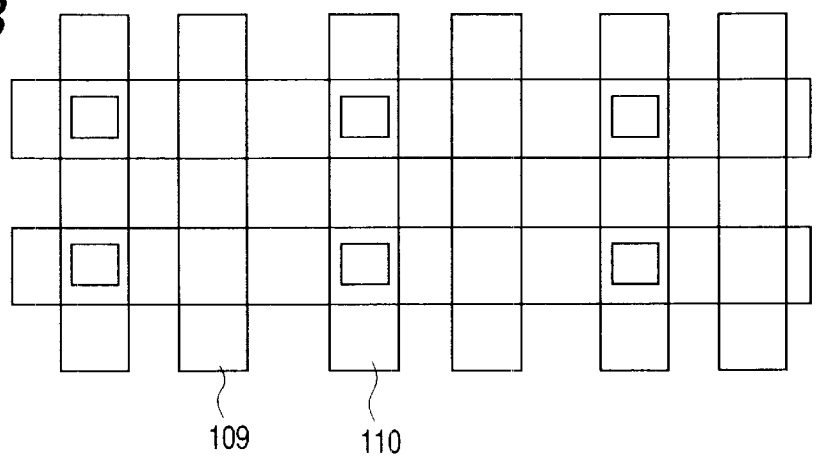
Figure 5:
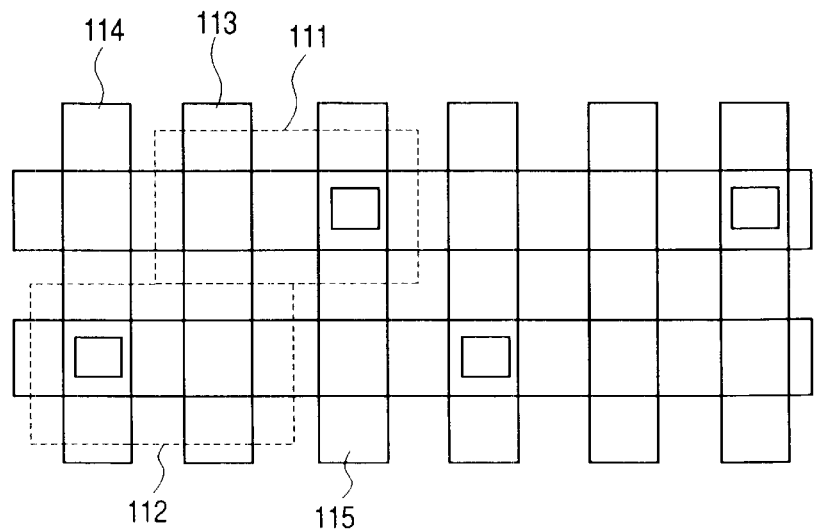
FIG. 5 is a schematic view of another array structure comprising semiconductor memory elements of the fourth embodiment.
Figure 34A:
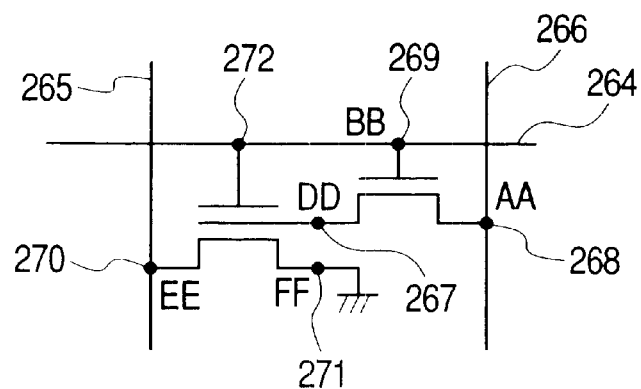
FIG. 34A is an equivalent circuit diagram of a unit structure corresponding to the first embodiment.
Figure 34B:
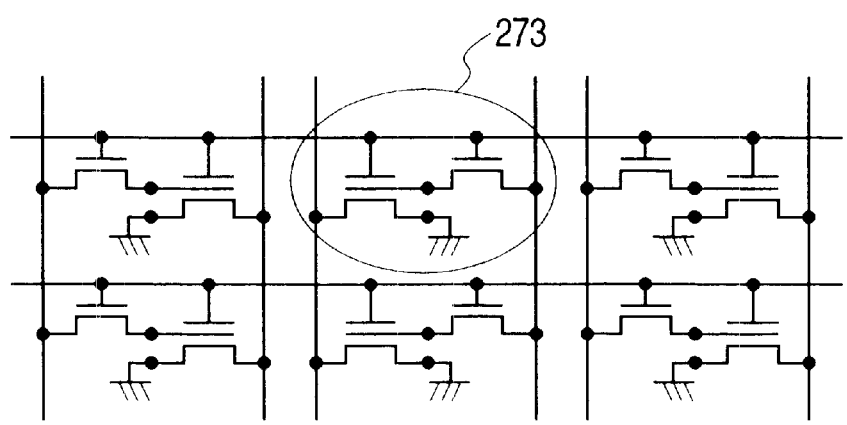
FIG. 34B is a circuit diagram of an array structure of the first embodiment corresponding to the array structure in FIG. 4A.
Figure 35A:
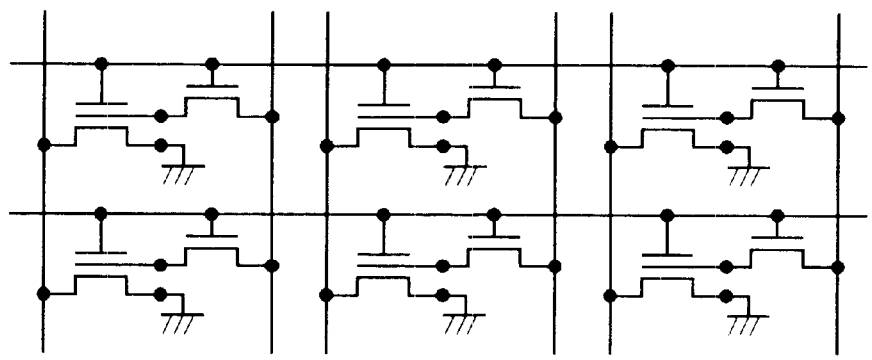
FIG. 35A is an equivalent circuit diagram of an array structure of the first embodiment corresponding to the array structure in FIG. 4B.
Figure 35B:
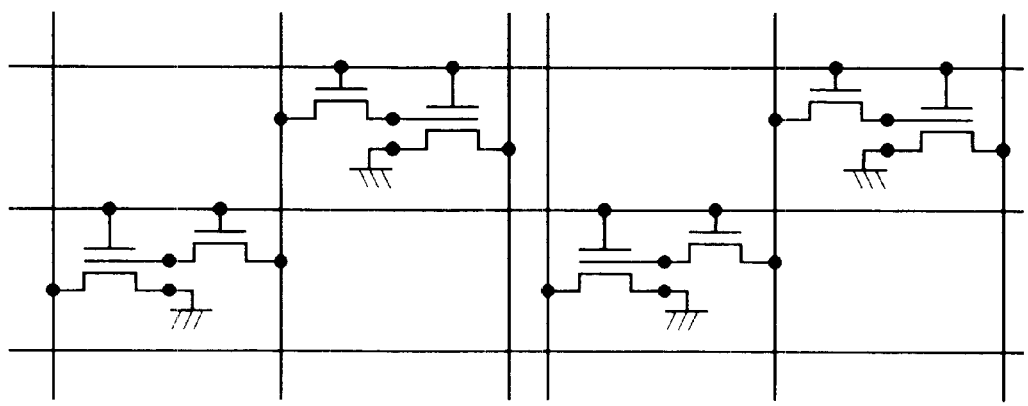
FIG. 35B is a circuit diagram of an array structure of the first embodiment corresponding to the array structure in FIG. 5.

Another $SiO_2$ film is then deposited to achieve flatness, followed by contact and wiring processes. As described, although the fourth embodiment adopts a three-dimensional structure, the fabrication does not involve any lithography process in the presence of vertically staggered components. FIGS. 3, 4A, 4B and 5 are top views of wiring in effect when memory elements of the fourth embodiment are arrayed into memory cell arrays. FIG. 3 shows wiring of a unit structure, while FIGS. 4A, 4B and 5 depict wiring of array structures. Each control electrode 5 is connected to a write/read word line 40, the drain 8 of each read transistor to a read data line 41, and the drain 2 of each write transistor to a write data line 42. FIG. 34A is an equivalent circuit diagram of a unit structure corresponding to the first embodiment. In this structure, the source 1 of each write transistor is connected via a node DD 267 to the charge accumulating region 1 of the corresponding read transistor; the drain 2 of each write transistor is connected via a node AA 268 to a write data line 266; and the control electrode 5 of each write transistor is connected via a node BB 233 to a word line 264. The source 223 of each read transistor is connected via a node FF 235 to a source line; the drain 8 of the read transistor is connected via a node EE 270 to a read data line 265; and the control electrode 5 of the read transistor is connected via a node CC 272 to the word line 264. Where a memory cell array is constituted, the array area is affected significantly not only by the area of each element used but also by the number of lines installed. In this respect, the element structure of the fourth embodiment having the control electrode 5 shared by the read and write transistors proves to be effective as well. In the fourth embodiment, the direction of the channel current through the read transistor is arranged to be in parallel with the direction of the read word line 40. However, this is not limitative of the invention, and other directional arrangements may be adopted instead. Still, the directional arrangement of the fourth embodiment permits sharing of diffusion layers of read transistors in a plurality of memory elements arrayed in the direction of the read data lines, thereby reducing the number of contacts for connecting the drains 8 of the read transistors with the read data lines 41. FIG. 4A shows a memory cell array wherein unit structures are arranged in a horizontally symmetrical fashion. That is, the write data lines 107 are arranged in pairs and so are the read data lines 108. The layout permits sharing of source regions between the paired read data lines 108, which contributes to reducing the array area. FIG. 34B is an equivalent circuit diagram of the layout. A unit cell structure is shown enclosed by an ellipse. The fourth embodiment does not explicitly indicate source lines because the diffusion layers of source regions in different rows are shared and used as source lines of read transistors. In practice, the word lines need to be contacted in increments of a suitable line count and connected to metal wiring. Obviously, the source region of the read transistor in each cell may be contacted and connected to a metal source line. The latter arrangement, at the expense of a considerably increased area, offers the advantage of reducing resistance so that a large read transistor current may be employed to carry out high-speed read operations. Unlike the configuration of FIG. 4A in which the elements are arranged in a horizontally symmetrical manner, the layout of FIG. 4B involves repeating the same structure. That is, the read data line 109 and write data line 110 are repeated one after another. An equivalent circuit diagram of the layout is shown in FIG. 35A. This structure affords stable read performance at the expense of a slightly enlarged area because, unlike in the structure of FIG. 4A, the source regions cannot be shared between adjacent columns. The stable performance is attributable to the fact that the read data lines are spaced apart in FIG. 4B while they are contiguous to one another and are thus vulnerable to fluctuations of the potential in the adjacent lines in the structure of FIG. 4A. The read operation may be stabilized alternatively by fixing the potential of every other write data line. In the array structure of FIG. 5, cells 111 and 112 belonging to contiguous read data lines 114 and 115 share a write data line 113. Every second cell belongs to the same word line. This structure, with a slightly reduced memory density, is nevertheless conducive to having the read data lines constituted in a back-to-back data line arrangement that provides large noise margins. An equivalent circuit diagram of the structure is shown in FIG. 35B.

Figure 6:
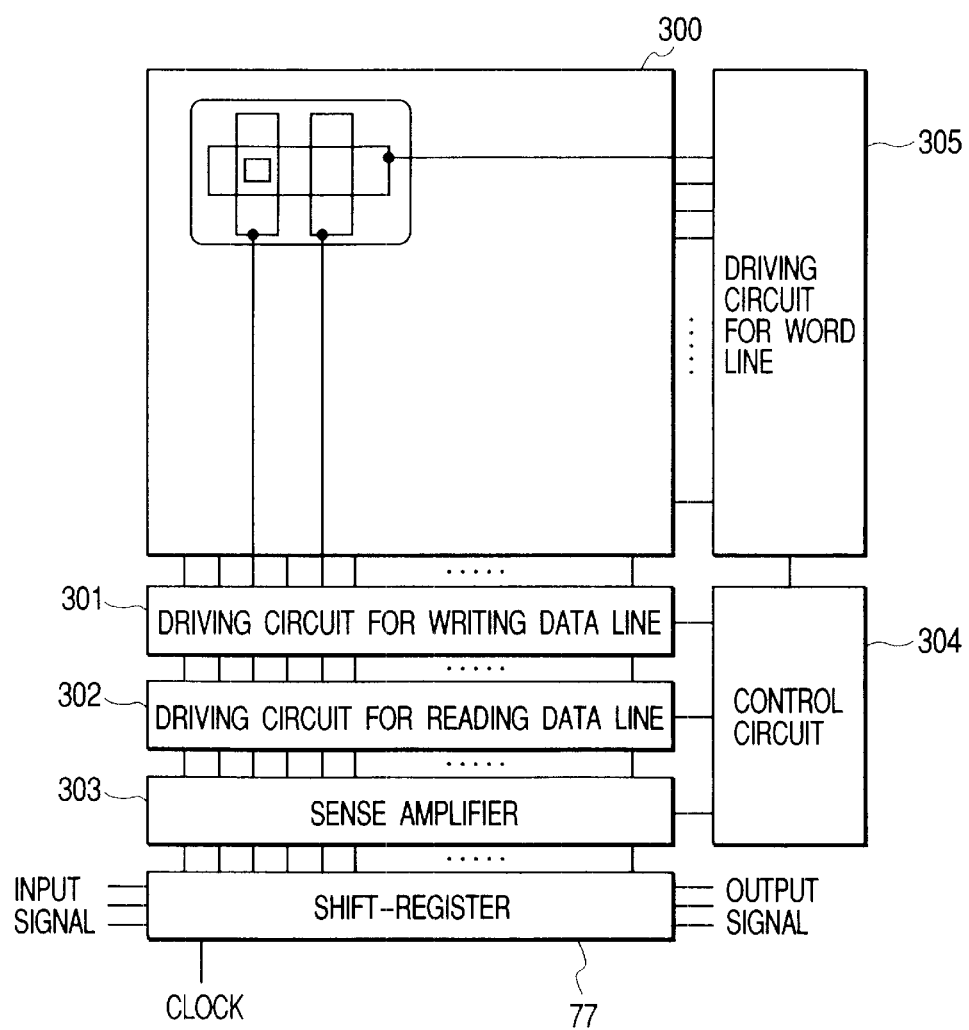
FIG. 6 is a block diagram of a semiconductor memory device based on the fourth embodiment.

FIG. 6 is a block diagram of a semiconductor memory device including memory cell arrays of the fourth embodiment. This is a nonvolatile semiconductor memory device that does not perform refresh operations. With a write transistor threshold value set for a sufficiently high level, the memory retains its data when power is removed. Obviously, it is also possible to hold data by utilizing a backup power supply that fixes the word line potential to a holding voltage. The latter option provides better data holding stability and helps reduce the write voltage. As another alternative, the data retention period may be set for several weeks to several months. In such cases, the memory device is refreshed only upon power-up or before power is removed. That kind of design is effective in reducing power dissipation and is particularly suited for applications of portable, battery-driven devices. Data input and output operations are carried out serially via a shift register 77. The fourth embodiment permits setting of a larger write transistor-ON current when designed as a volatile memory than when designed to be a nonvolatile storage. The volatile memory design provides high-speed write performance. The volatile or nonvolatile memory design may be combined with the random or serial data access arrangement in any way desired.

Fifth Embodiment

Figure 7:
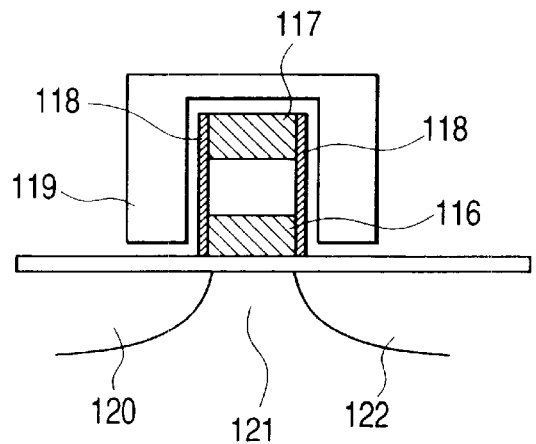
FIG. 7 is a cross-sectional view of a semiconductor memory element practiced as a fifth embodiment of the invention.

FIG. 7 shows a semiconductor memory element practiced as the fifth embodiment of the invention. The memory element has a write and a read transistor. The write transistor is composed of a source (charge accumulating region) 116, a drain 117, a control electrode 119 and a channel 118; the read transistor is constituted by a source 120, a drain 122, a control electrode 119 and a channel 121. The channel 118 of the write transistor is made of a polycrystal silicon film 3 nm in average thickness containing boron (B). As in the first embodiment, the control electrode 119 is shared by the write and read transistors. The relations of voltages applied for element operations are also the same as those in the first embodiment. With the fourth embodiment, it is necessary to make holes each reaching the charge accumulating region 1. That means each charge accumulating region 1 is required to be greater in area than each of these holes. To meet the requirement may illustratively involve forming the source 7 and drain 8 in self-aligning relation to the charge accumulating region 1. In such a case, it is difficult to form read transistors that have a short channel length each. With the fifth embodiment, by contrast, a reduced size of the charge accumulating region 116 permits the forming of read transistors having a small area and a large ON-current. It should be noted, however, that the channel 118 and control electrode 119 of the write transistor are difficult to fabricate because of their staggered structures.

Sixth Embodiment

Figure 10:
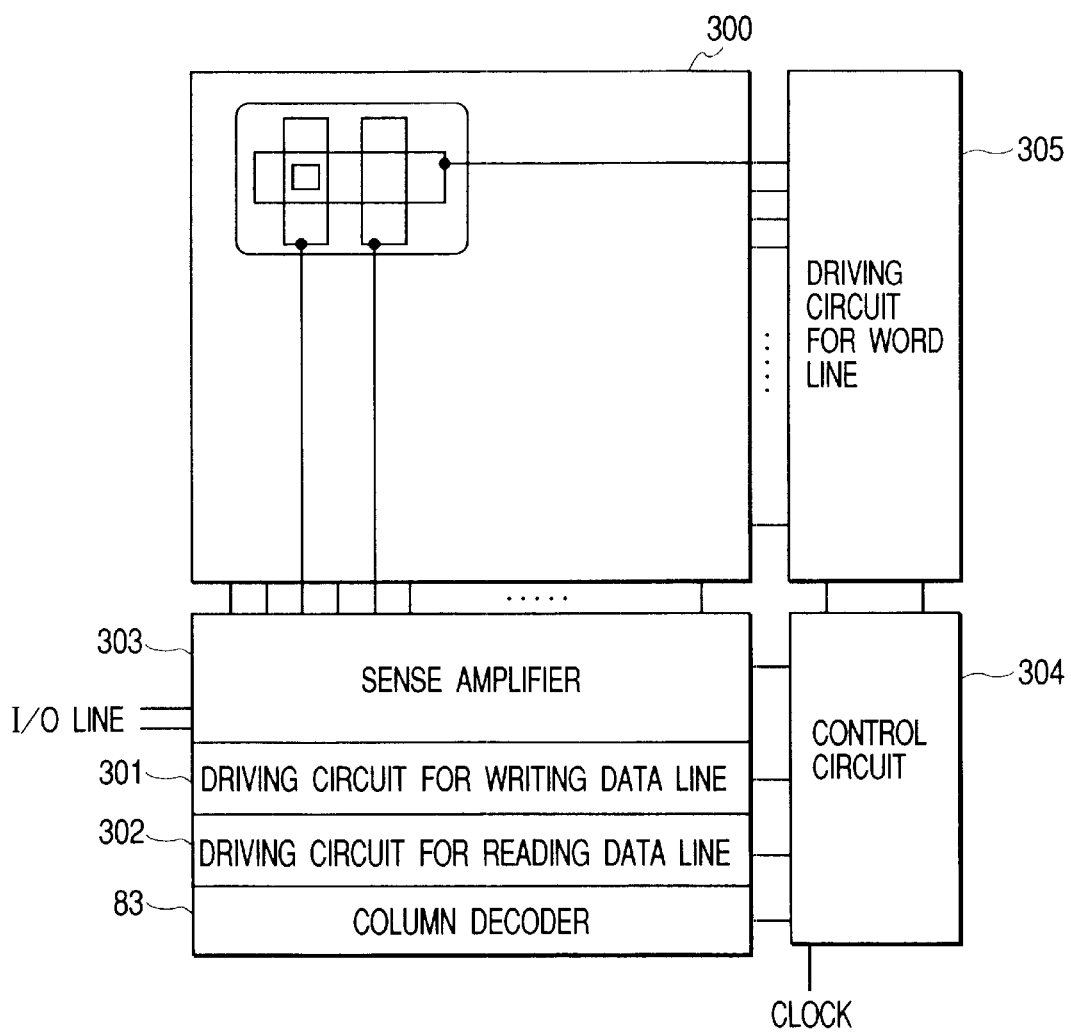
FIG. 10 is a block diagram of a semiconductor memory device practiced as a sixth embodiment of the invention.

FIG. 10 shows a semiconductor memory device practiced as the sixth embodiment of the invention. The memory cell structure of this device is basically the same as the array structure of the fourth embodiment shown in FIG. 5, except that the channel of the write transistor in each memory element of the sixth embodiment is a polycrystal silicon film 4.5 nm in average thickness. The resistance in effect when transistors are on is reduced to permit high-speed write operations. With its reduced resistance shortening the data retention time, the sixth embodiment functions as a volatile memory. With this embodiment, data input and output operations are carried out randomly by use of a column decoder 83.

Figure 11:
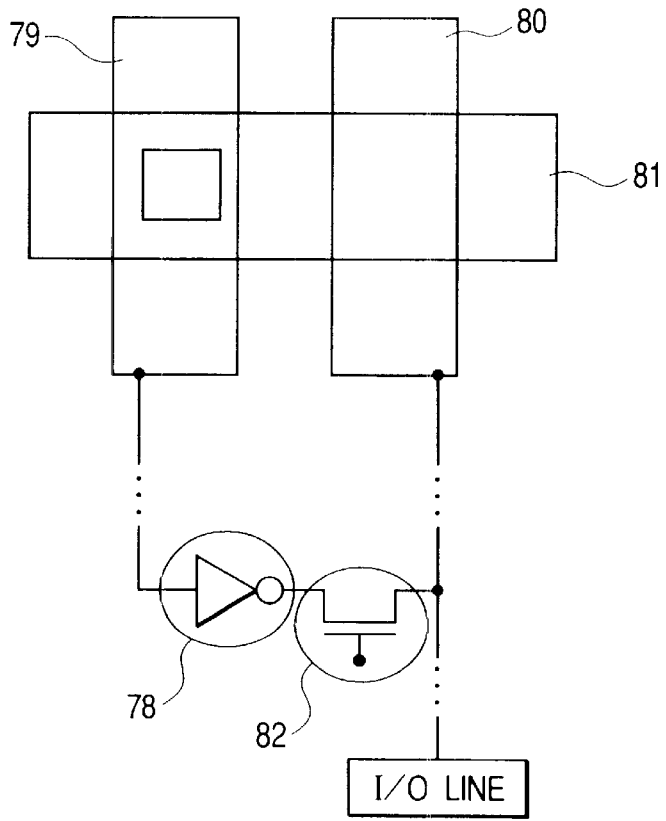
FIG. 11 is a circuit diagram for explaining a refresh operation of the semiconductor memory device as the sixth embodiment.

How the sixth embodiment as a volatile random access memory is refreshed is described below with reference to FIG. 11. In a refresh or a read operation, a voltage amplified by a sense amplifier appears on a read data line 79. This voltage is the reverse of the voltage applied to a write data line 80 in a write operation. Opening a switch 82 writes to the write data line 80 the data rendered the same as those supplied in the write operation because of the intervention of an inverter 78. Closing the switch 82 to feed a write pulse to a word line 81 enables another write operation.

Seventh Embodiment

Figure 8A:
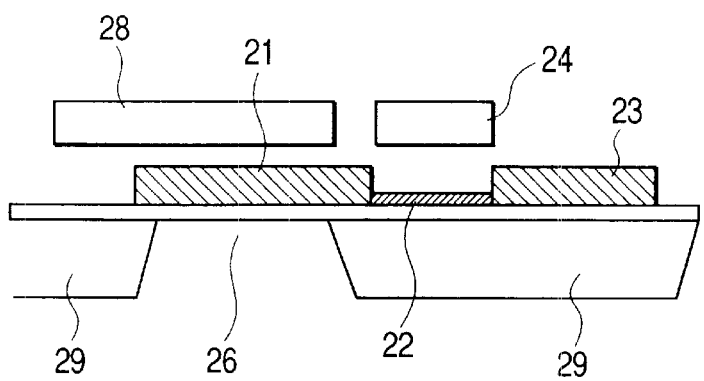
FIG. 8A is a cross-sectional view taken in parallel with a channel of a write transistor in a semiconductor memory element practiced as a seventh embodiment of the invention.
Figure 8B:
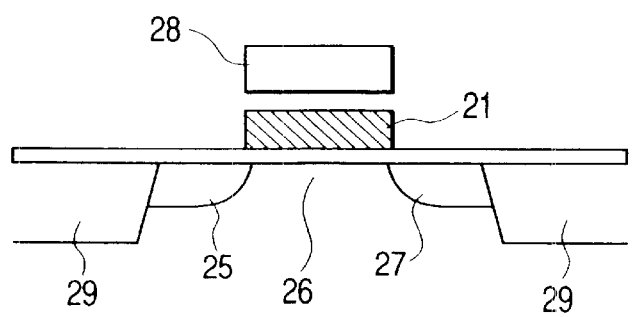
FIG. 8B is a cross-sectional view taken in parallel with a channel of a read transistor in the semiconductor memory element as the seventh embodiment.
Figure 9:
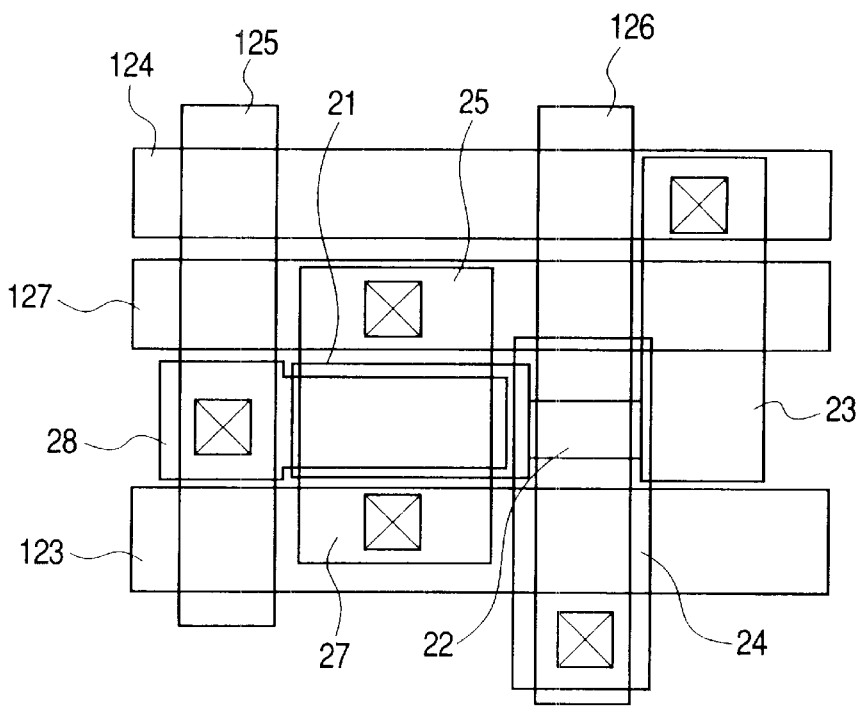
FIG. 9 is a top view of the semiconductor memory element as the seventh embodiment.

FIGS. 8A, 8B and 9 depict the seventh embodiment of this invention. FIG. 8A is a cross-sectional view taken on a section showing a write transistor comprising a source 21, a drain 23, a channel 22 and a control electrode 24, as well as a read transistor including a control electrode 28 and a channel 26. FIG. 8B is a cross-sectional view taken on a section perpendicular to the section of FIG. 8A and indicating a read transistor with a source 25 and a drain 27. The source 21 of the write transistor doubles as a charge accumulating region of this memory element. Also illustrated is an element isolating region 29 made of an insulator.

Unlike the fourth or the fifth embodiment, the seventh embodiment has no region shared by the write and read transistors, nor does this embodiment adopt a three-dimensional structure. As a result, the area occupied by the elements tends to be extensive. Still, the degree of freedom is considerable when it comes to establishing operating voltages. Another advantage is simplified fabrication proceedings. Specifically, the common fabrication configuration for MOS devices may be refitted with a minimum of modifications to produce the seventh embodiment. The seventh embodiment is thus well suited for getting its logic and memory portions formed on the same wafer.

Described below is how a memory element of the seventh embodiment works. A piece of data is written to a given memory element by driving High or Low the potential of the drain 23 in the write transistor and by altering the potential of the control electrode 24 to put the write transistor in the conductive state. The stored electrons are retained by lowering the potential of the control electrode 24 and by putting the write transistor in the nonconductive state. Different numbers of electrons in the charge accumulating region 21 correspond to different threshold voltages of the read transistor. Thus a piece of data held by a memory element is read out by detecting the magnitude of the current flowing through the read transistor under a predetermined voltage condition. In the read operation, the potential of the control electrode 24 is left low. As a result, with only a limited voltage applied between the source 21 and the drain 23, the retained data remain intact when read out.

FIG. 9 is a top view of wiring over a memory element of the seventh embodiment as included in a memory cell array. A unit cell is shown in FIG. 9. The drain 23 of the write transistor is connected to a write data line 126, and the source 25 and drain 27 of the read transistor are connected respectively to a source line 127 and a read data line 123. The control electrode 28 of the read transistor is connected to a read word line 125, and the control electrode 24 of the write transistor is connected to the write word line 126. The seventh embodiment provides different lines to all of the source 25, drain 27 and control electrode 28 of the read transistor, as well as to the drain 23 and control electrode 24 of the write transistor. Alternatively, some of the lines may be shared by components to reduce the occupied area. For example, the word line may be shared by the control electrodes to provide the same electrical connections as those in the fourth embodiment.

During fabrication, the charge accumulating region 21 of the read transistor is formed simultaneously with the drain region 23 of the write transistor, followed by the channel 22. At the time of channel formation, an Si thin film and an $SiO_2$ thin film are first deposited illustratively to 4 nm and 10 nm thick respectively. With a resist used as a mask, the deposited $SiO_2$ film is then wet-etched. After the resist is removed, the film structure is oxidized in an $O^2$ plasma atmosphere. This type of oxidation, unlike high-temperature oxidation, is slow to progress and thus suitable for oxidizing in a well-controlled manner a film of less than 10 nm in thickness (typically about 7 nm). The oxidation process oxidizes all Si thin film portions where the $SiO_2$ film was removed by wet-etching. In other words, those portions that have been masked by the $SiO_2$ film left over from the wet-etching remain unoxidized. This method of channel formation causes less damage to the read transistor than if the Si thin film is dry-etched. The method also permits minimizing wear on the source 21 and drain 23 of the write transistor. After a gate insulating film for the write transistor is deposited, the control electrode 28 of the read transistor and the control electrode 24 of the write transistor are formed.

Eighth Embodiment

Figure 12A:
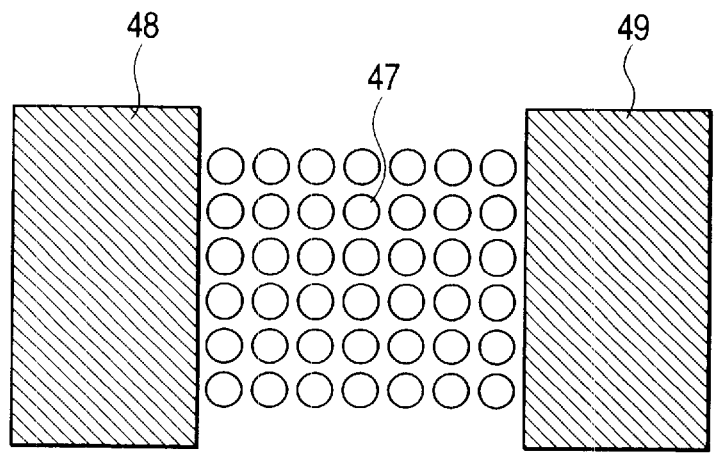
FIG. 12A is a schematic view showing a channel of a write transistor in a semiconductor memory element practiced as an eighth embodiment of the invention.
Figure 12B:
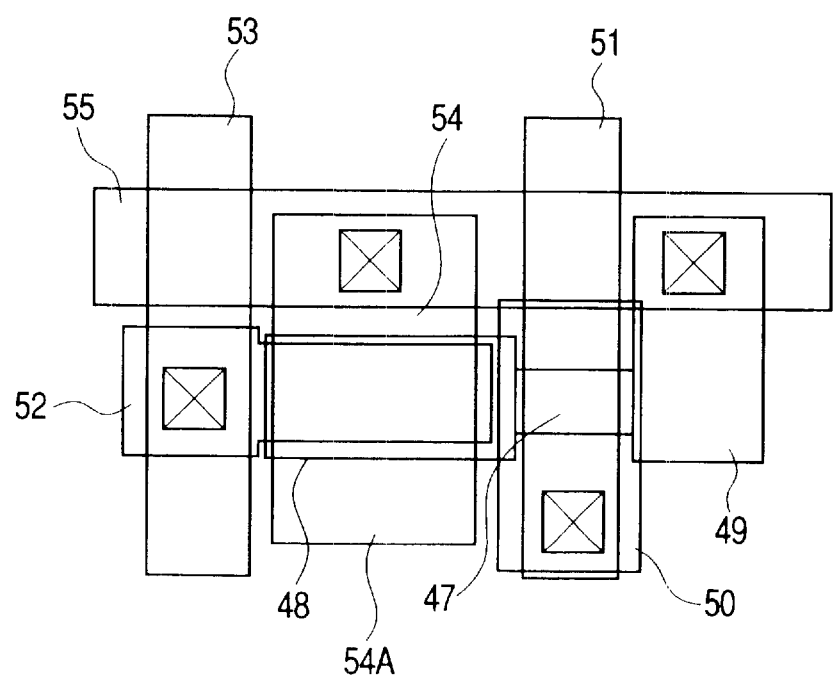
FIG. 12B is a top view of the semiconductor memory element as the eighth embodiment.

FIGS. 12A and 12B depict the eighth embodiment of this invention. The eighth embodiment differs from the seventh embodiment in terms of channels and wiring of write transistors.

FIG. 12A is a top view of a channel portion of a write transistor in the eighth embodiment in effect before the control electrode of the write transistor is formed. A source 48 and a drain 49 are the same in structure as those in the third embodiment, but a channel 47 is composed of silicon crystal grains each 4 nm in average diameter and arranged two-dimensionally. In a write operation, a voltage is applied to the control electrode to lower the potential of the channel 47. The tunnel effect allows carriers to pass through the crystal grains. When a piece of data is to be held, the crystal grains are depleted and a potential barrier is formed by the grains to prevent carrier leaks. The channel structure of the eighth embodiment is noted for its ability to permit quality control through parameters that are observable two-dimensionally such as crystal grain sizes and inter-grain distances. This structure makes quality control easier than other structures that require film thickness-based quality control. The channel structure of the eighth embodiment may be applied to channels of write transistors in other embodiments of this invention. Furthermore, the polycrystal silicon thin film discussed in connection with the fourth embodiment may be used in the channel structure of the write transistor for the eighth embodiment. FIG. 12B is a top view of wiring over a memory array comprising memory elements of the eighth embodiment. In the case of the fourth embodiment, the drain 23 of the write transistor was shown separated from the drain 27 of the read transistor; for the eighth embodiment, these drains are electrically connected by metal wiring. Specifically, the drain 49 of the write transistor and a drain 54 of the read transistor are both connected to a write/read data line 55; a control electrode 52 of the read transistor is connected to a read word line 53 and a control electrode 50 of the write transistor is connected to a write word line 51. When the word lines are thus provided in pairs, there is no possibility of leak currents getting larger in the write transistor at the time of a write operation.

Figure 36A:
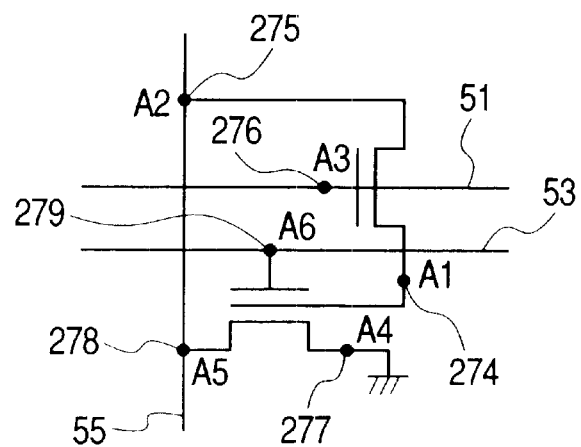
FIG. 36A is an equivalent circuit diagram of a unit structure according to the eighth embodiment.
Figure 36B:
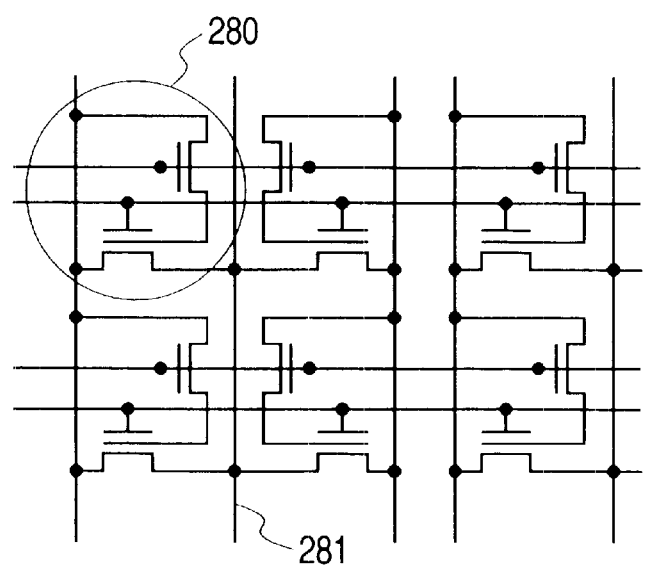
FIG. 36B is a circuit diagram illustrating how a source region is shared by adjacent cells in the unit memory structure of the eighth embodiment in FIG. 12B.

FIG. 36A is an equivalent circuit diagram of a unit cell structure pursuant to the above connective relations of the eighth embodiment. A source 48 of a write transistor is connected via a node A1 274 to a charge accumulating region 48 of a read transistor; a drain 49 of the write transistor is connected via a node A2 275 to a data line 55; and a control electrode 50 of the write transistor is connected via a node A3 276 to a write word line 51. A source 54A of the read transistor is connected via a node A4 227 to a source line; a drain 54 of the read transistor is connected via a node A5 278 to the data line 55; and a control electrode 53 of the read transistor is connected via a node A6 279 to a read word line 53. In a write operation, the data line 55 is driven either High or Low depending on the piece of data to be written, and the write word line 51 is brought High. At this point, the read word line 53 is driven Low to turn off the read transistor. In a read operation, the data line 55 is precharged to a potential higher than 0 V before the read word line 53 is brought High. At this point, the write word line 51 is driven Low to turn off the write transistor. In the read operation, the potential of the data line 55 drops more precipitously when that data line is driven High than when the line is brought Low. Through amplification by a sense amplifier, the data line potential is thus raised to a level corresponding to the reverse of the data in effect at the time of the write operation. The density of configured memory cells is also affected by the number of lines required. Having the data line 55 arranged to be shared between write and read operations reduces the number of lines and thereby enhances recording density. In the structure of FIG. 12B, the source region 54A of the read transistor may be shared by an adjacent cell to reduce the occupied area. FIG. 36B is a circuit diagram of cell arrays using such a layout. A unit cell structure is shown enclosed by a circle 280, and the source line 281 is shown to be shared between cells.

Figure 13:
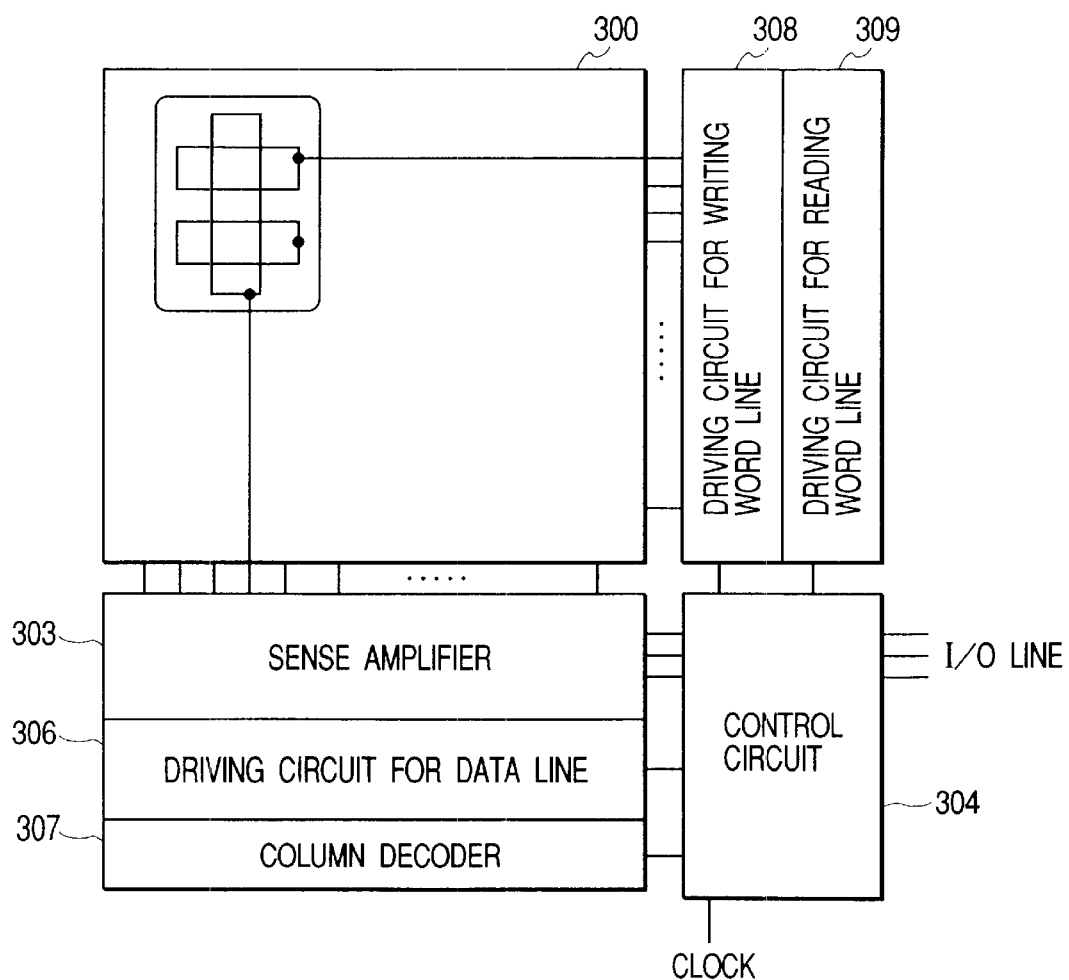
FIG. 13 is a block diagram of a semiconductor memory device based on the eighth embodiment.

FIG. 13 is a block diagram of a semiconductor memory device utilizing memory cells of FIGS. 12A and 12B as its basic elements. Rotating the configuration in FIG. 12B by 90 degrees gives the layout of FIG. 13. In terms of refresh operations, the eighth embodiment with its shared use of data lines differs fundamentally from the fourth embodiment. Specifically, in a read operation, the eighth embodiment gets retrieved data amplified as the reverse of the data that were written previously. In a rewrite operation, the data line settings are used unmodified. That means the data stored in each cell are reversed in polarity every time they are refreshed. A counter is thus provided to count the number of times each word line is selected. When a piece of data is to be read out, the corresponding word line selection count being odd or even is logically operated with the retrieved data, and the result of the logical operation is output to the outside. Alternatively, the source line 281 may be driven High to retrieve the data having the same polarity as in the preceding write operation. The refresh cycle is one hour. Any access is suppressed upon each refresh operation, which delays access speed. Whereas it is common practice to refresh DRAMs at intervals of several to dozens of microseconds, the eighth embodiment has a refresh cycle of as long as one hour. The reduced refresh frequency affords low power dissipation. Limited access delays attributable to refresh operations repeated at very long intervals permit high-speed performance.

Ninth Embodiment

Figure 22:
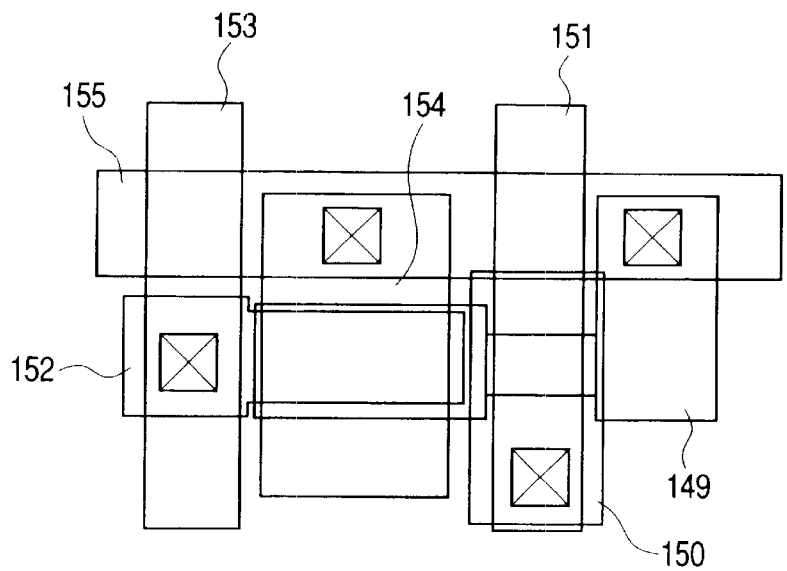
FIG. 22 is a top view of a semiconductor memory element practiced as a ninth embodiment of the invention.

FIG. 22 shows a semiconductor memory element practiced as the ninth embodiment of the invention. With the ninth embodiment, one element stores two-bit data. The memory cell structure is the same as that in FIG. 12B, except that the channel is made of a polycrystal silicon film 3 nm thick. A drain 149 of a write transistor and a drain 154 of a read transistor are both connected to a write/read data line 155. A control electrode 152 of the read transistor is connected to a read word line 153, and a control electrode 150 of the write transistor is connected to a write word line 151.

How the ninth embodiment works will now be described. It is assumed that the two-bit data to be written represent 0, 1, 2 and 3. A piece of data is written by feeding the data line 155 with a potential corresponding to the data in question and by applying a pulse to the write word line 151. Unlike the one-bit data write operation, the two-bit data write operation involves feeding one of four potentials to the data line 155. Each of the potentials has a different amount of stored charges. On a flash memory, so-called verify operations are carried out to check and adjust stored data during multivalued storage operations. The verification is needed because the amount of stored charges, given the same pulses, still varies with characteristic variations between elements. With the inventive memory element, the potential supplied to the data line 155 is reflected unmodified in the amount of stored charges. As a result, there is few variations in the quantity of stored charges between memory elements. This means the verify operation is not needed or may be carried out but over a time period much shorter than usual. A read operation takes place in two stages. First, the data line 155 is precharged and a predetermined read potential is fed to the read word line 153 which is sensed to check if the piece of data is 0, 1, 2 or 3. Then the data line 155 is again precharged and a potential either higher or lower than the read potential depending on the result of the check is supplied to the read word line 153 which is sensed to distinguish 0 and 1, or 2 and 3. There are only limited margins for memory elements such as those of conventional DRAMs that use stored charges in charging or discharging data lines. Because each read operation is destructive, the above-described two-stage read operation is not feasible and some other schemes are needed in its place. For these reasons, the ninth embodiment is particularly advantageous as a memory element for multivalued storage.

The inventive arrangement above is not limited to structures wherein the drain regions of the write and read transistor are shared therebetween. Although the ninth embodiment is designed to accommodate two-bit data, this is not limitative of the invention which also applies to other multivalued storage schemes.

Tenth Embodiment

Figure 14:
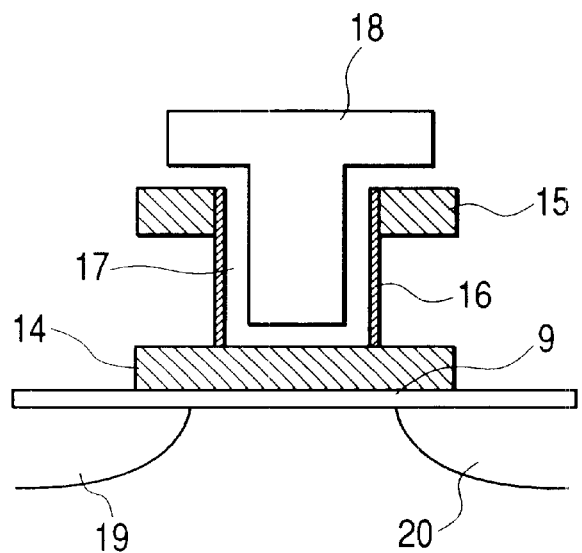
FIG. 14 is a cross-sectional view of a semiconductor memory element practiced as a tenth embodiment of the invention.

FIG. 14 is a cross-sectional view of a semiconductor memory element practiced as the tenth embodiment of the invention. In terms of cross-sectional views, the tenth embodiment is similar to the first embodiment but works in a manner different from the latter. Thus where memory elements are arranged into memory cell arrays, the elements making up the ninth embodiment are interconnected differently from those constituting the first embodiment.

In the tenth embodiment, the source (charge accumulating region) 14, drain 15, control electrode 18 and channel 16 of the write transistor correspond exactly to their counterparts in the first embodiment. As in the fourth and the fifth embodiments, the source (charge accumulating region) 14, drain 15 and control electrode 18 of the write transistor are constituted by polycrystal silicon while the channel 16 is made of a non-doped polycrystal silicon film 3 nm in average thickness. The source 19 and drain 20 of the write transistor correspond to their counterparts in the first embodiment, except that the control electrode 15 doubles as the drain 15 of the write transistor. In the tenth embodiment, an $Si_3N_4$ film 17 is deposited after the read transistor is formed. That is because amorphous silicon subsequently deposited on the $Si_3N_4$ film is controlled more easily than on other films in terms of film thickness for the formation of write transistor channels.

The memory element of the tenth embodiment works in the same manner in the write operation as its counterpart of the fourth embodiment. In a read operation, the potential of the control electrode 18 for the write transistor is held low to keep the write transistor in the nonconductive state. In that state, the potential of the control electrode 15 for the read transistor is raised. At this point, the threshold voltage varies depending on the number of electrons stored in the charge accumulating region 14. Because the potential of the control electrode 5 for the write operation by the first embodiment is set to be higher than the potential of the control electrode 5 for the read operation, there is a possibility that the read transistor in the write operation is placed in an enhanced ON-state, which can trigger a current flow. In another possibility, the write transistor may be slightly turned on under a read condition, which may cause the stored charges to be lost. With the tenth embodiment, the control electrode 18 of the write transistor is independent of the control electrode 15 of the read transistor. The arrangement places the read transistor in a high-resistance state for the write operation and puts the write transistor in a high-resistance state for the read operation.

Figure 15:
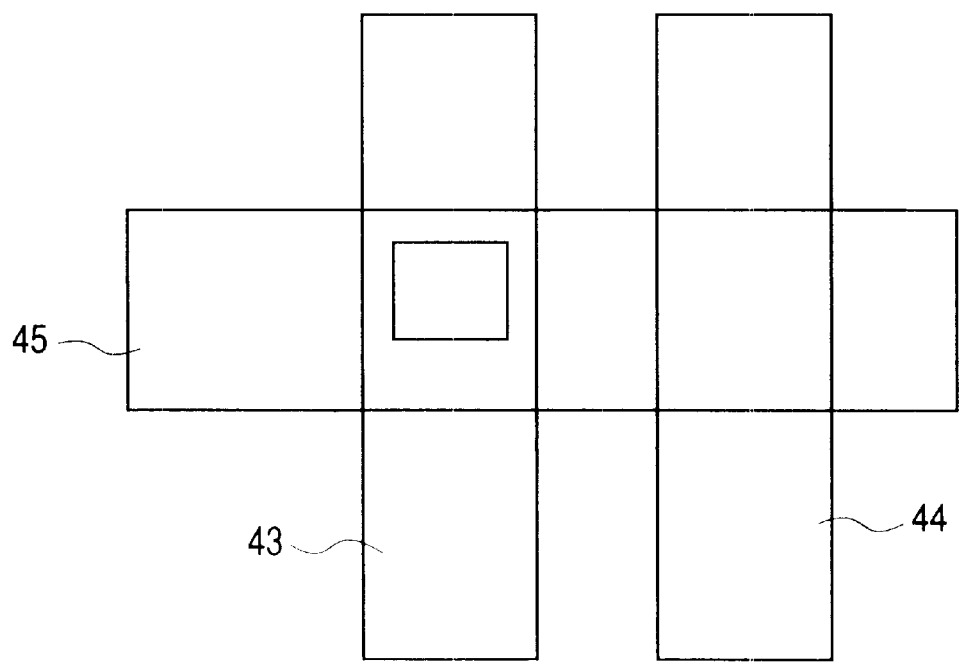
FIG. 15 is a top view sketching wiring of the semiconductor memory element as the tenth embodiment.
Figure 16:
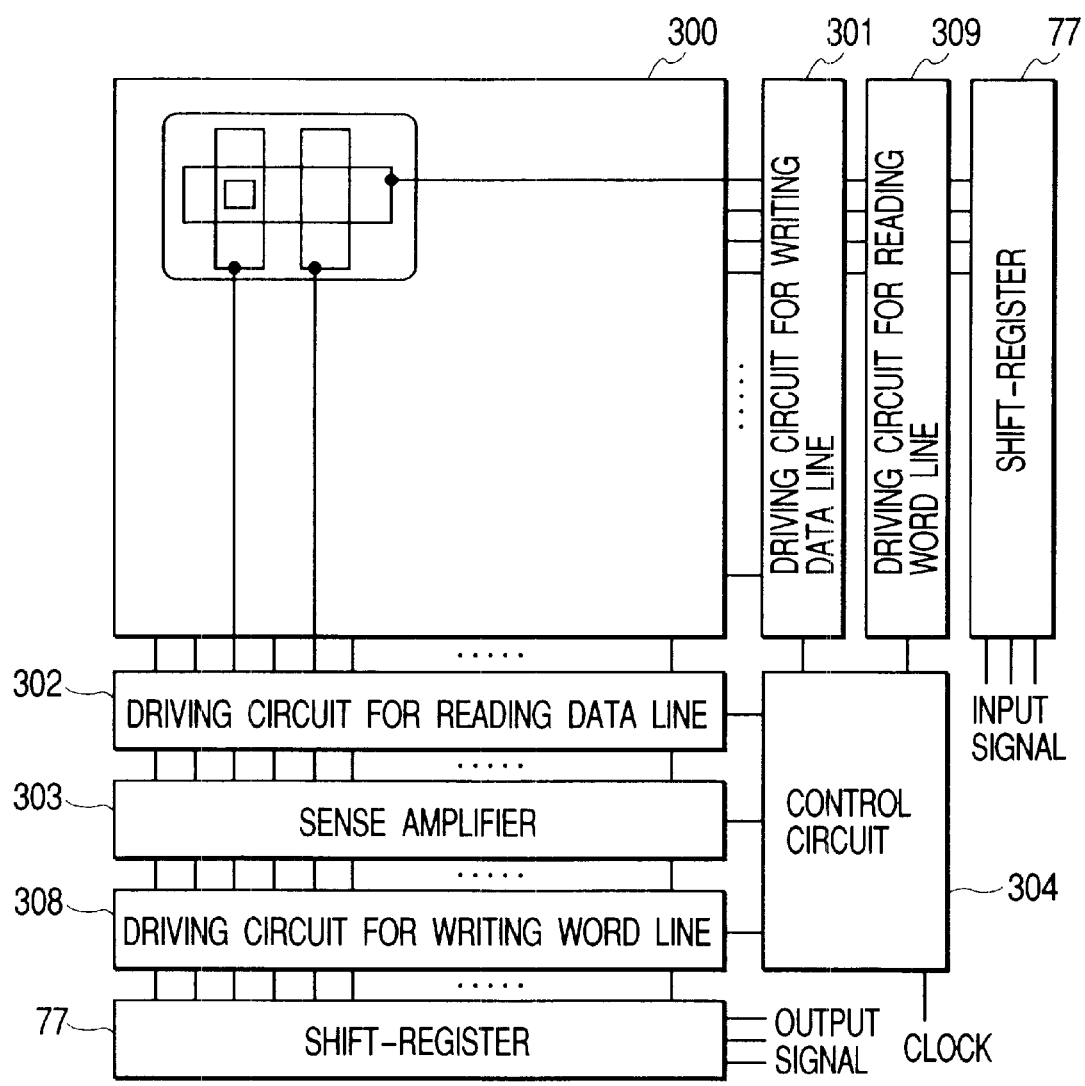
FIG. 16 is a block diagram of a semiconductor memory device based on the tenth embodiment.

FIG. 15 is a top view showing wiring of memory elements of the tenth embodiment arranged into a memory cell array. A control electrode 18 of a write transistor is connected to a write word line 43; a drain 20 of a read transistor is connected to a read data line 44; and a drain 15 of the write transistor is connected to a write data line/read word line 45. This configuration differs from that of the first embodiment in that the write word line 43 is positioned in parallel with the read data line 44. FIG. 16 is a block diagram of a semiconductor memory device having a memory cell array composed of memory cells of the tenth embodiment as basic elements. This is a memory structure for serial access. This configuration has the write word lines 43 intersecting perpendicularly with the read word lines 45, and includes an input register and an output register. As such, the structure is suitable for handling large-scale matrix data. It is also possible to utilize a decoder in order to implement random access input or output.

Eleventh Embodiment

Figure 17A:
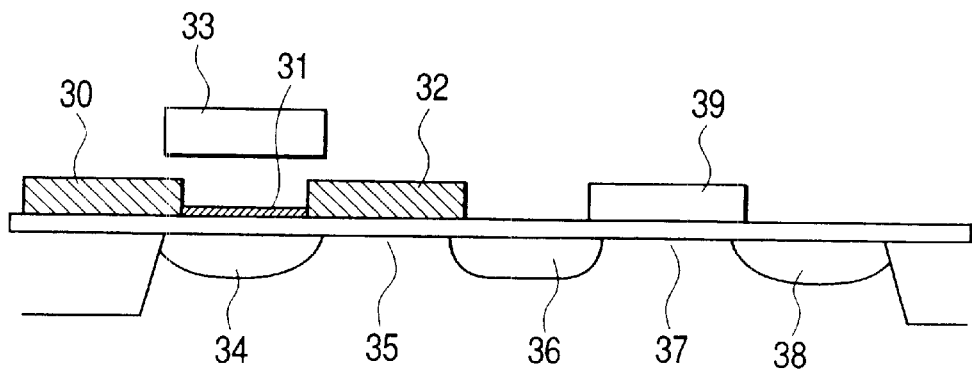
FIG. 17A is a cross-sectional view of a semiconductor memory element practiced as an eleventh embodiment of the invention.
Figure 17B:
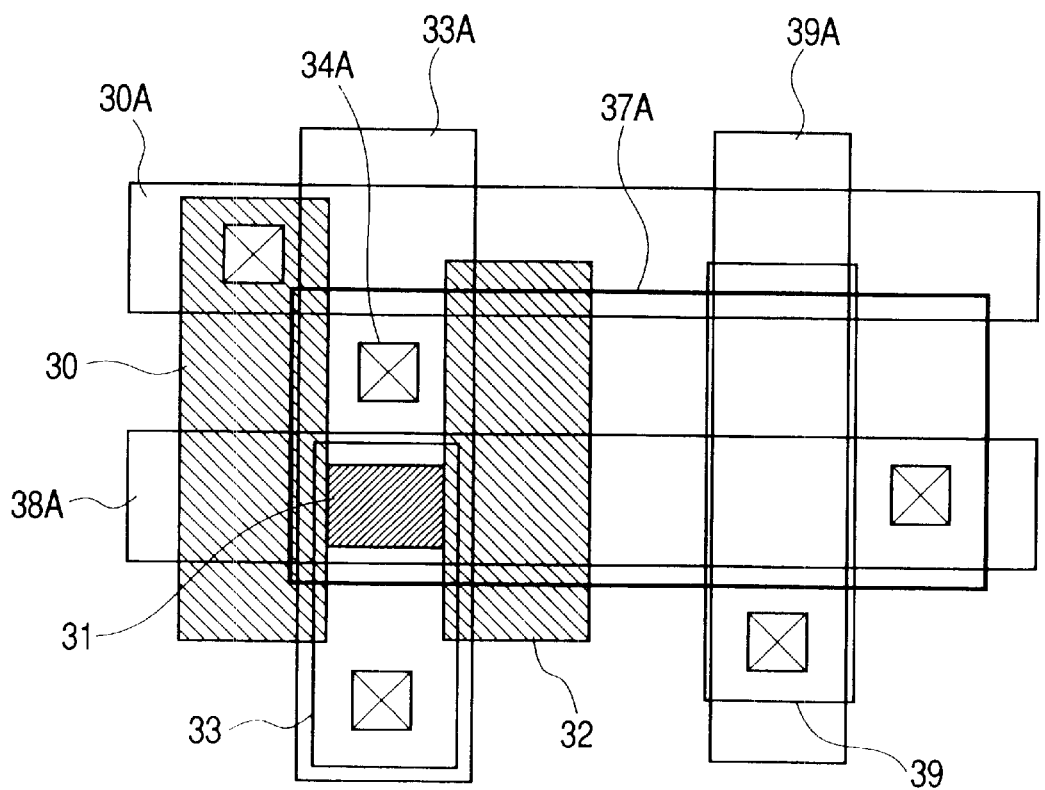
FIG. 17B is a top view of the semiconductor memory element as the eleventh embodiment.

FIGS. 17A and 17B depict a semiconductor memory element practiced as the eleventh embodiment of the invention. FIG. 17A is a cross-sectional view of this semiconductor memory element in which a source 32, a drain 30, a channel 31 and a control electrode 33 of a write transistor are the same in structure as their counterparts in the fourth embodiment. The read transistor is structurally different. That is, a control electrode 32 of each read transistor doubles as its charge electrode region; there is no other control electrode for the read transistor. A change in conductance between a source 34 and a drain 36 of the read transistor reflecting the amount of stored charges is read out in a read operation. In that case, the read transistor in question can stay on depending on its contents, which is detrimental to controlling a matrix-type storage configuration. That bottleneck is bypassed by installing another transistor to be selected for a read operation. The added transistor comprises a source 36, a drain 38, a channel 37 and a control electrode 39, and is made to conduct upon read operation. FIG. 17B is a top view of the semiconductor memory element as the eleventh embodiment. The view includes wiring for a matrix formation. All wires associated with the source region 34 are omitted and only contact holes 34A are indicated. An active region 37A is shown enclosed by thick lines. The drain region 30 and control electrode 33 of each write transistor are connected to a write data line 30A and a write word line 33A respectively, and the drain region 38 and control electrode 39 of each read transistor are connected to a read data line 38A and a read word line 39A respectively. At the expense of its expanded area because of the presence of its added transistors, the eleventh embodiment is far easier to fabricate than the fourth embodiment.

As opposed to the first through the seventh embodiments wherein the control electrode of each read transistor is set for capacitive coupling via the charge accumulating region to control the potential of the channel region, the eleventh embodiment has the channel region directly controlled in potential by use of the control electrode. This makes it easier for the eleventh embodiment to operate on a lower voltage than the other embodiments.

Twelfth Embodiment

Figure 18:
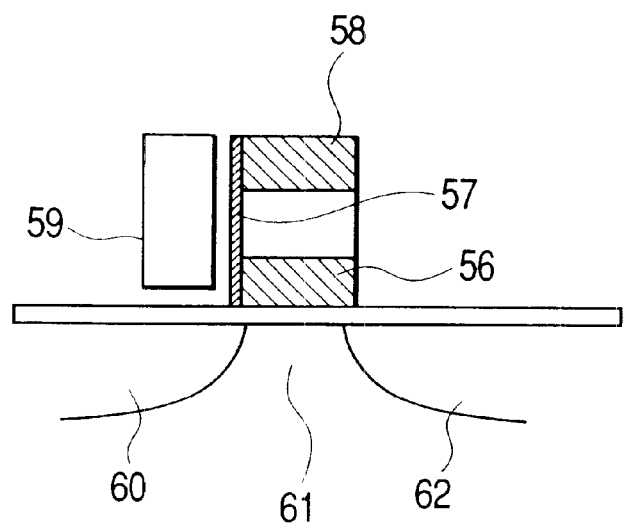
FIG. 18 is a cross-sectional view of a semiconductor memory element practiced as a twelfth embodiment of the invention.
Figure 19:
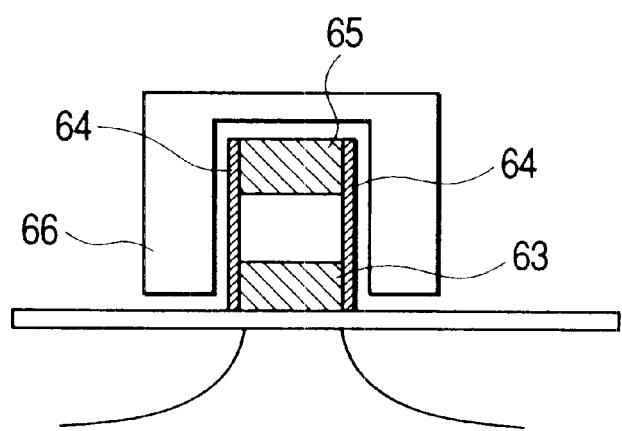
FIG. 19 is a cross-sectional view depicting another element structure of the semiconductor memory element as the twelfth embodiment.
Figure 20A:
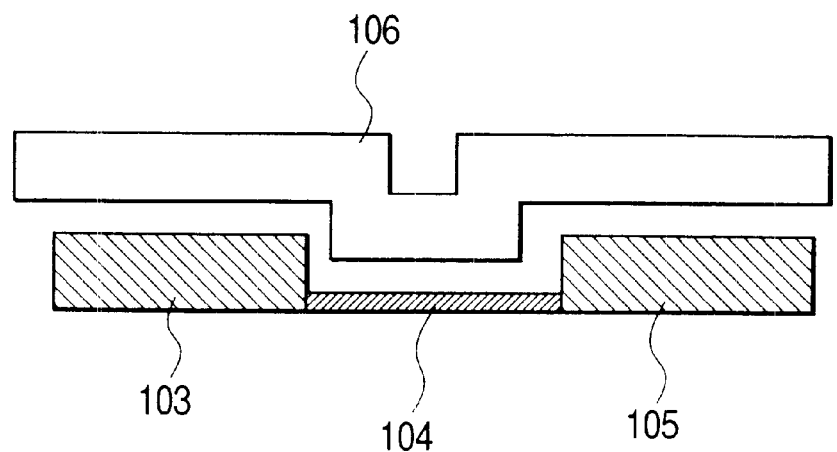
FIG. 20A is a cross-sectional view of an experimental transistor studied prior to creation of this invention.
Figure 20B:
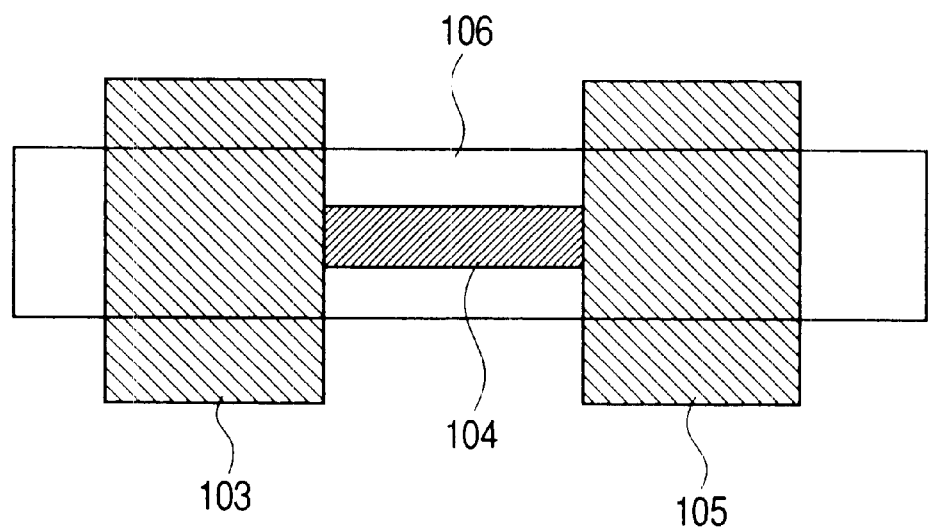
FIG. 20B is a top view of the experimental transistor.
Figure 21A:
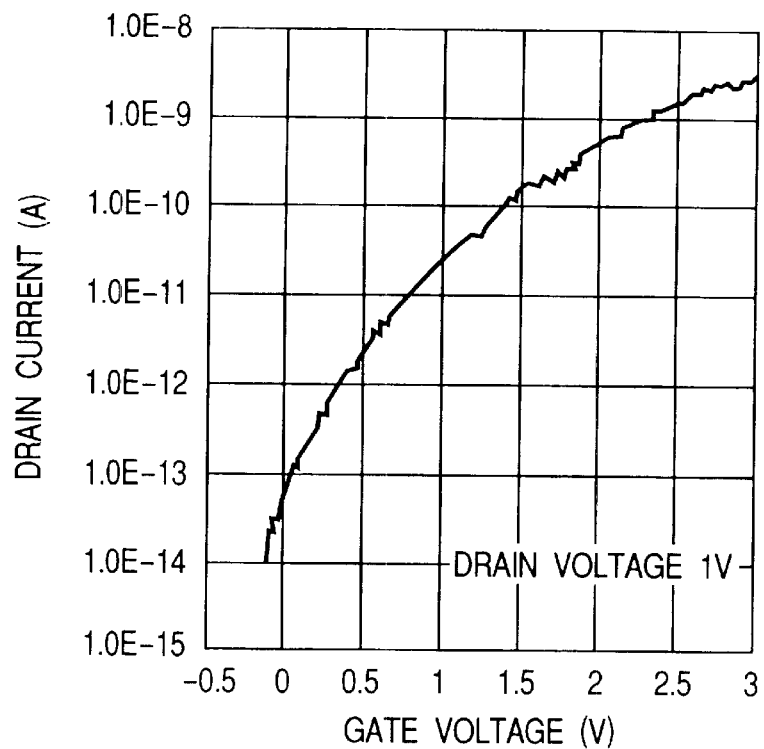
FIG. 21A is a graphic representation showing drain current variations with respect to a gate voltage in the experimental transistor.
Figure 21B:
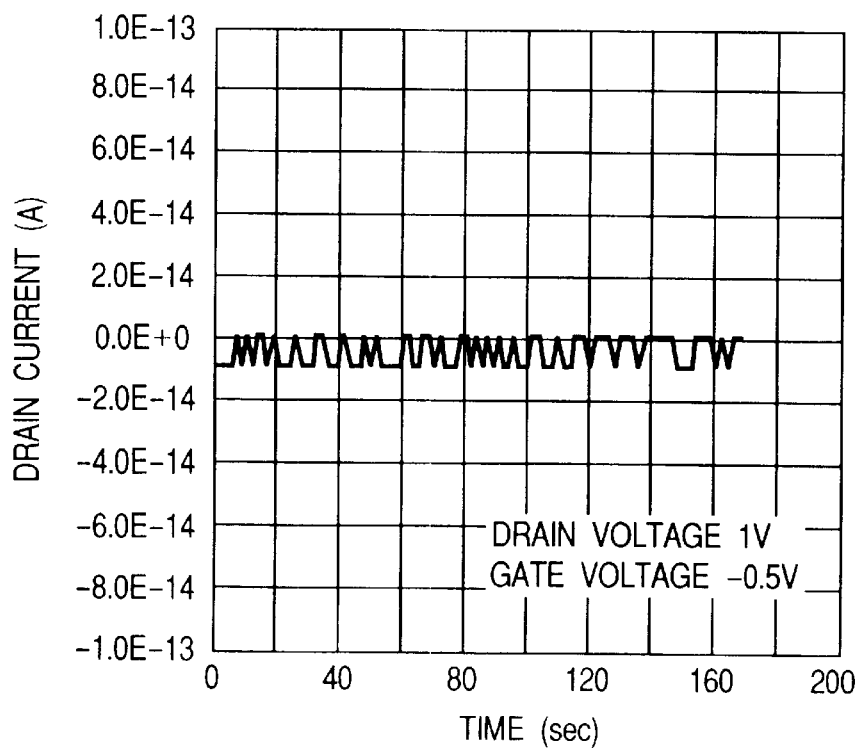
FIG. 21B is a graphic representation illustrating leak current variations over time in the experimental transistor.

FIG. 18 shows a semiconductor memory element practiced as the twelfth embodiment of this invention. The memory element of FIG. 18 has a write transistor and a read transistor. The write transistor includes a source (charge accumulating region) 56, a drain 58, a control electrode 59 and a channel 57; the read transistor comprises a source 60, a drain 62, a control electrode 58 and a channel 61. The channel 57 of the write transistor is made of a polycrystal silicon film 3 nm in average thickness containing boron (B). As with the seventh embodiment, the drain 58 of the write transistor doubles as the control electrode 58 of the read transistor. The voltages to be applied for operations are also the same as those used in the seventh embodiment. For the seventh embodiment, it is necessary to make holes each reaching the charge accumulating region 14. That means each charge accumulating region 14 is required to be greater in area than each of these holes. To meet the requirement may illustratively involve forming the source 19 and drain 20 of the read transistor in self-aligning relation to the charge accumulating region 14. In such a case, it is difficult to form read transistors that have a short channel length each. With the twelfth embodiment, by contrast, a reduced size of the charge accumulating region 14 permits the forming of read transistors having a small area and a large ON-current. A memory element of a similar structure is shown in FIG. 19 wherein a drain 65 of each write transistor is flanked by channels 64. The configuration of FIG. 19 is similar to that of the fifth embodiment but assigns different roles to its components. That means ways to control the components are different. Because the width of channels 64 is doubled in the same structure as that of FIG. 18, the structure of FIG. 19 has a larger ON-current for its write transistors and thus permits write and delete operations at higher speed.

Thirteenth Embodiment

Figure 28A:
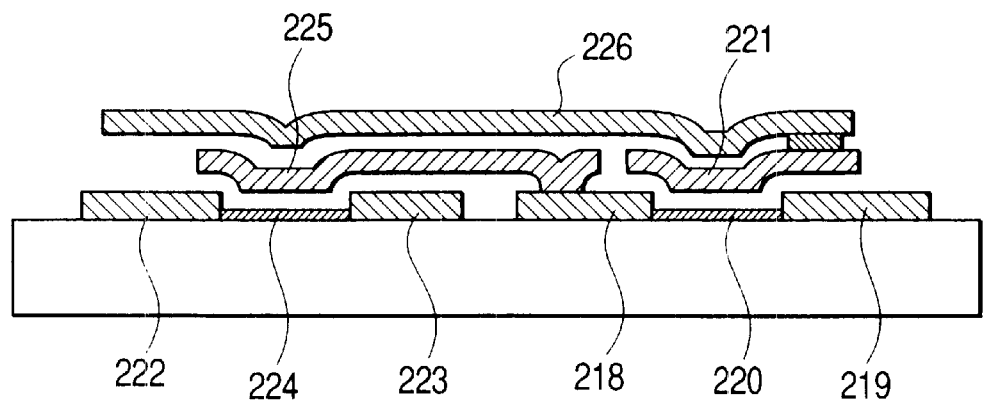
FIG. 28A is a cross-sectional view of a semiconductor memory element practiced as a thirteenth embodiment of the invention.
Figure 28B:
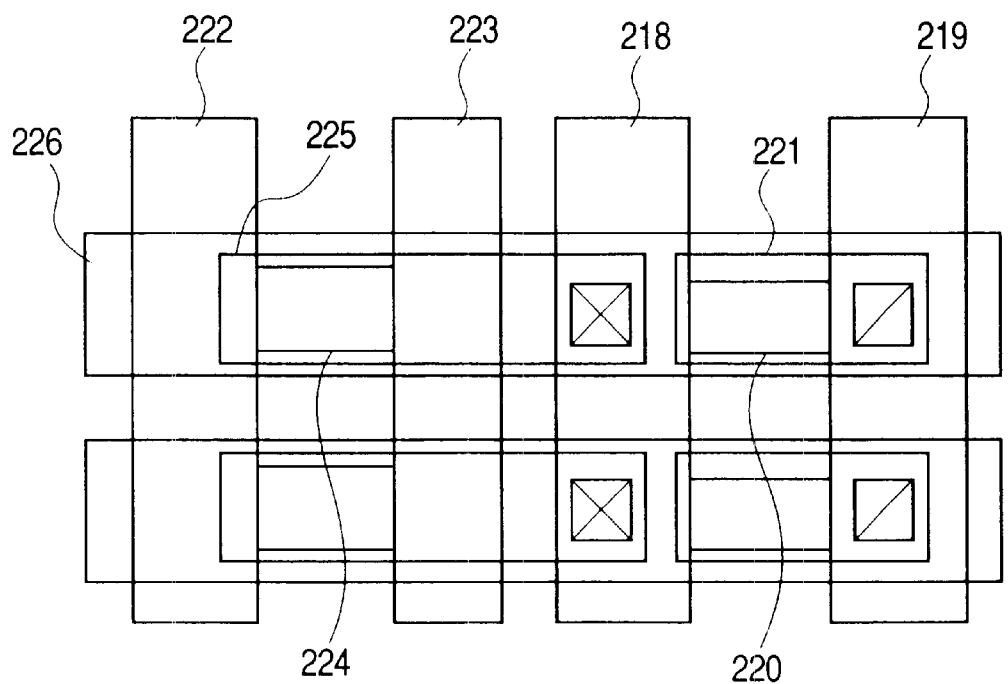
FIG. 28B is a top view of two semiconductor memory elements of the thirteenth embodiment, arranged side by side.
Figure 29A:
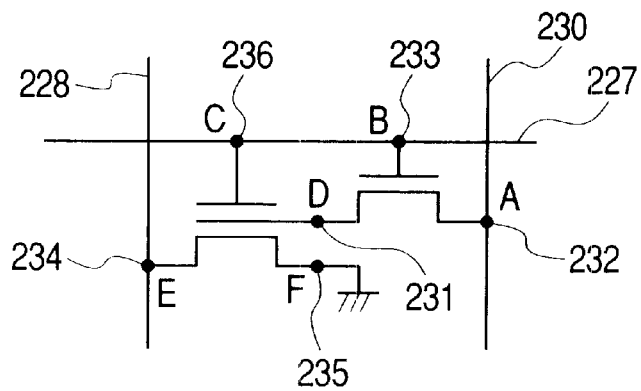
FIG. 29A is a circuit diagram of a semiconductor memory element of the thirteenth embodiment corresponding to the element shown in FIG. 28A.
Figure 29B:
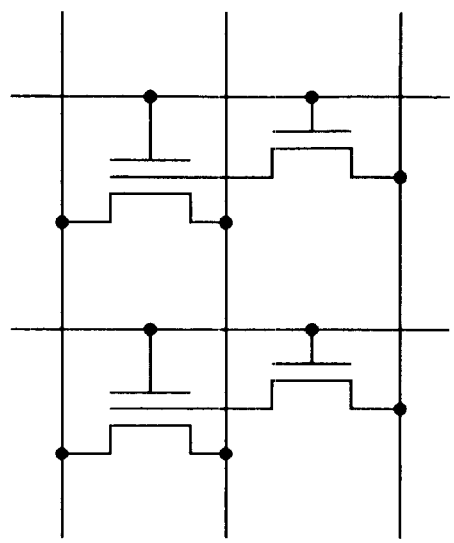
FIG. 29B is a circuit diagram of semiconductor memory elements of the thirteenth embodiment corresponding to the elements shown in FIG. 28B.
Figure 30:
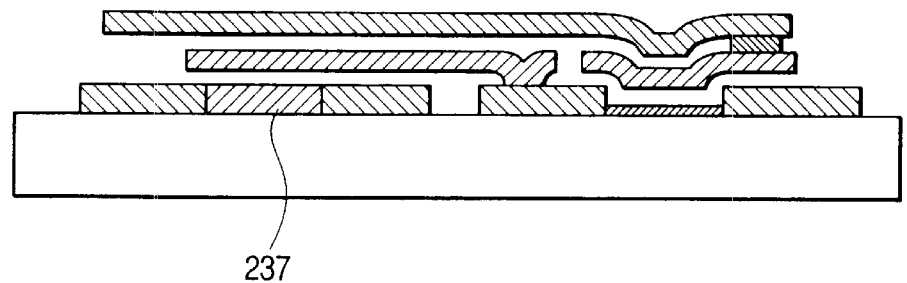
FIG. 30 is a cross-sectional view depicting another element structure of the semiconductor memory element as the thirteenth embodiment.

FIGS. 28A and 28B show semiconductor memory elements practiced as the thirteenth embodiment of the invention. FIG. 28A is a cross-sectional view of one such memory element, and FIG. 28B is a top view (layout view) of a two-cell structure having memory elements of FIG. 28A arranged side by side. The thirteenth embodiment utilizes an SOI substrate. Each write transistor made of a source 218, a drain 219, a channel 220 and a control electrode 221 is structurally the same as its counterpart in the first embodiment. A source 222, a drain 223, a channel 224, a charge accumulating region 225 and a control electrode 226 constitute each read transistor. Of the components of the read transistor, the source 223, drain 222, channel 224 and charge accumulating region 225 are the same in structure as their counterparts in the first embodiment. In the thirteenth embodiment, the control electrode 221 of the write transistor is electrically connected to the control electrode 226 of the read transistor. This type of wiring takes up less area than a disconnected wiring arrangement. As with the first fourth embodiment, the thirteenth embodiment causes the charge accumulating region 225 to be electrically charged or discharged via each write transistor, and allows data to be retrieved as a threshold voltage change in each read transistor. The thirteenth embodiment takes up wider area than the fourth embodiment utilizing a three-dimensional structure, but is noted for a larger read transistor current and faster read operations thanks to the use of a single crystal substrate. Because of its ability to minimize variations in read and write transistor characteristics, the thirteenth embodiment offers more stable performance than other configurations. The thirteenth embodiment is suitable for operating on a lower voltage because there is no need to determine voltage settings by taking voltage margins into consideration. Threshold voltages may vary between the write and the read transistors. For example, the threshold voltage for the write transistor may be set to be higher than that for the read transistor so as to reduce leak currents. The surface of the SOI substrate may be utilized for the formation of logic circuits. Furthermore, as shown in FIG. 30, the channel 237 of each read transistor may be formed by a film thicker than that which constitutes the channel of each write transistor. This configuration allows a larger channel current to flow through the read transistor while suppressing leak currents in the write transistor. FIGS. 29A and 29B show equivalent circuits of the thirteenth embodiment. FIG. 29A depicts an equivalent circuit of the unit cell structure shown in FIG. 28A. In this circuit, the source 218 of the write transistor is connected via a node D 231 to the charge accumulating region 225 of the read transistor; the drain 219 of the write transistor is connected via a node A 232 to a write data line 230; and the control electrode 221 of the write transistor is connected via a node B 233 to a word line 227. The source 223 of the read transistor is connected via a node F 235 to a source line; the drain 223 of the read transistor is connected via a node E 234 to a read data line 228; and the control electrode 226 of the read transistor is connected via a node C 236 to the word line 227. FIG. 29B illustrates an equivalent circuit having two cells of FIG. 28B arranged side by side.

Fourteenth Embodiment

Figure 31:
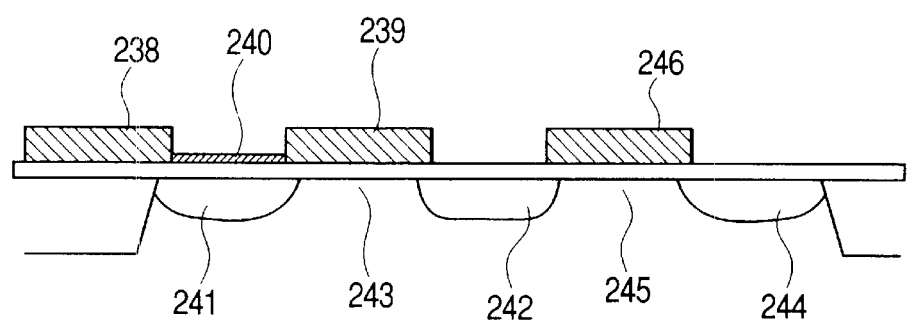
FIG. 31 is a cross-sectional view of a semiconductor memory element practiced as a fourteenth embodiment of the invention.

FIG. 31 is a cross-sectional view of a semiconductor memory element practiced as the fourteenth embodiment of the invention. This structure is similar to that of the eleventh embodiment; a source 239, a drain 238 and a channel 240 of each write transistor are made of polycrystal silicon. Unlike the eleventh embodiment, the fourteenth embodiment does not have the control electrode in the elevated position. As with the eleventh embodiment, the fourteenth embodiment comprises write transistors each having its source 239 also acting as a charge accumulating region 239; read transistors each comprising a source 241, a drain 242 and a channel 243; and selection transistors each including a source 242, a drain 244, a channel 245 and a control electrode 246. In the fourteenth embodiment, a diffusion layer 250 is used in place of gate electrodes. The fourteenth embodiment requires a fewer number of fabrication steps than the structure of FIGS. 17A and 17B and is thus conducive to being formed into a memory device at lower costs. In particular, the fourteenth embodiment is suited for use in a hybrid mounting configuration involving logic portions because the embodiment implements a memory function by simply having a common MOS structure supplemented with channels 240.

Fifteenth Embodiment

Figure 32:
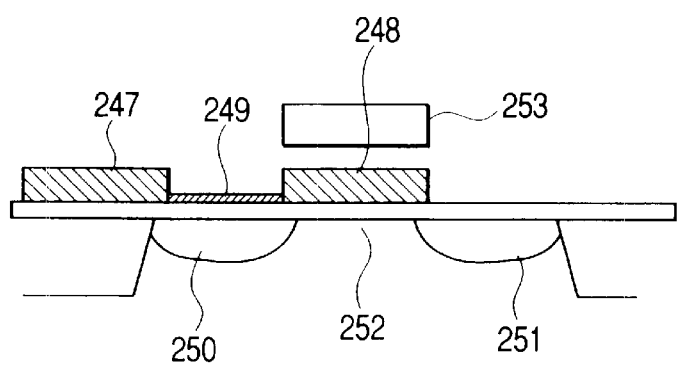
FIG. 32 is a cross-sectional view of a semiconductor memory element practiced as a fifteenth embodiment of the invention.

FIG. 32 is a cross-sectional view of a semiconductor memory element practiced as the fifteenth embodiment of the invention. As in the fourteenth embodiment, a source 248, a drain 247 and a channel 249 of each write transistor are made of polycrystal silicon and a diffusion layer 250 acts as control electrodes. Each read transistor comprises a source 250, a drain 251, a channel 252, a charge accumulating region 248 and a control electrode 248. In the structure of the seventh embodiment as shown in FIGS. 8A and 8B, the control electrode 24 of the write transistor must be separated from the control electrode 28 of the read transistor to prevent short-circuiting when these electrodes are formed in the same fabrication step. By contrast, the fifteenth embodiment has no need for such clearance and thus constitutes a memory cell structure taking up less area than other structures.

Sixteenth Embodiment

Figure 33A:
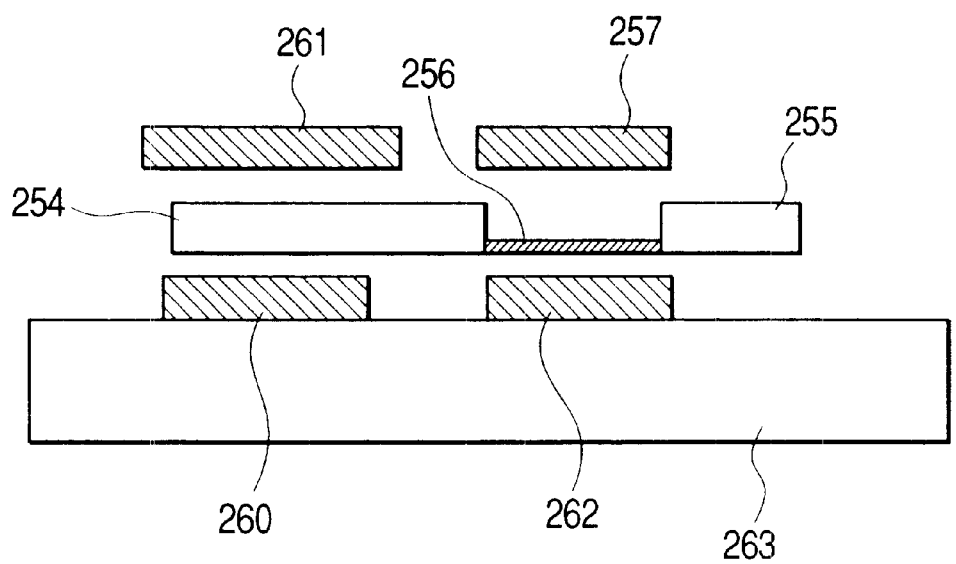
FIG. 33A is a cross-sectional view taken in parallel with a channel of a write transistor in a semiconductor memory element practiced as a sixteenth embodiment of the invention.
Figure 33B:
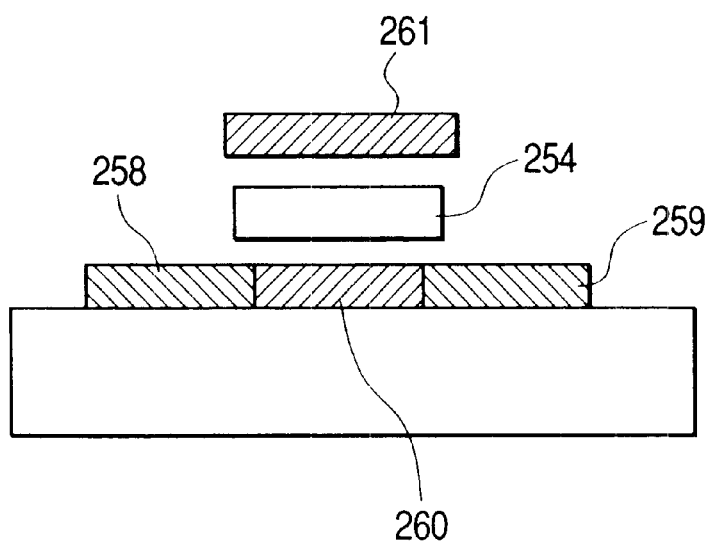
FIG. 33B is a cross-sectional view taken in parallel with a channel of a read transistor in the semiconductor memory element as the sixteenth embodiment.

FIGS. 33A and 33B are cross-sectional views of semiconductor memory elements practiced as the sixteenth embodiment of the invention. This embodiment utilizes an SOI substrate. FIG. 33A is a cross-sectional view taken on a section showing a write transistor comprising a source 254, a drain 255, a channel 256, a first control electrode 257 and a second control electrode 262, as well as a read transistor including a control electrode 261 and a channel 260. FIG. 33B is a cross-sectional view taken on a section perpendicular to the section of FIG. 33A and indicating a read transistor with a source 258 and a drain 259. The source 254, drain 255, channel 256 and first control electrode 257 of the write transistor, as well as the control electrode 261 of the read transistor are made of polycrystal silicon. The second control electrode 262 of the write transistor, and the source 258, drain 259 and channel 260 of the read transistor are formed by single crystal silicon of the substrate. The sixteenth embodiment is characterized in that the channel 256 of each write transistor has a double-gate structure made up of the first and second control electrodes 257 and 262. This structure increases the capacities of the control electrodes and channels 256 and is thus conducive to minimizing leak currents through the write transistors. In addition, the sixteenth embodiment allows a larger ON-current to flow through each write transistor, executing write operations at a higher speed than before.

Seventeenth Embodiment

Figure 37:
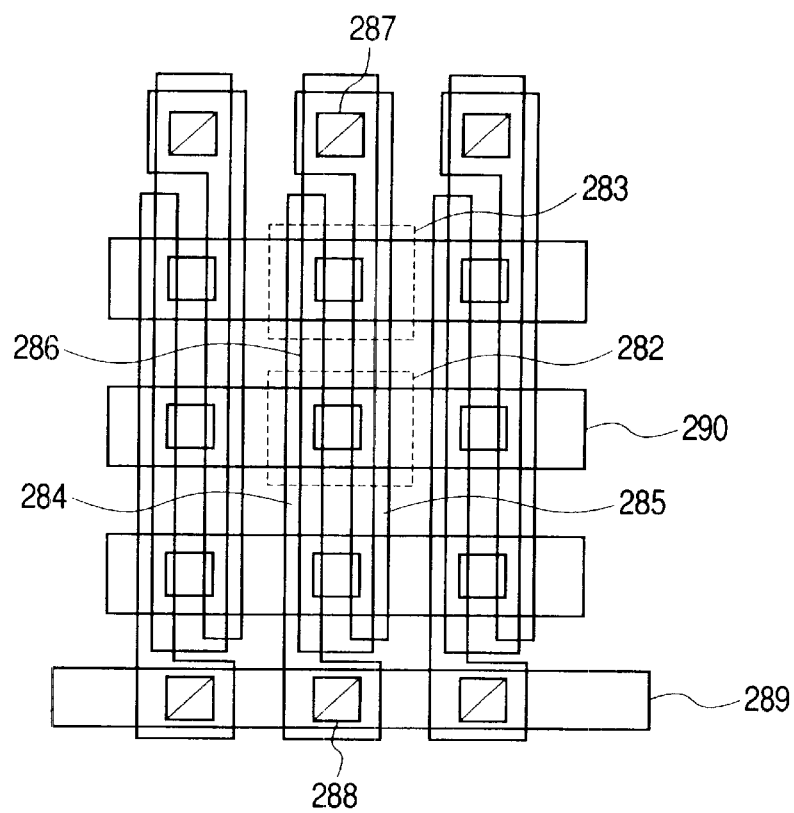
FIG. 37 is a top view of a memory mat of a semiconductor memory device practiced as a seventeenth embodiment of the invention.
Figure 38:
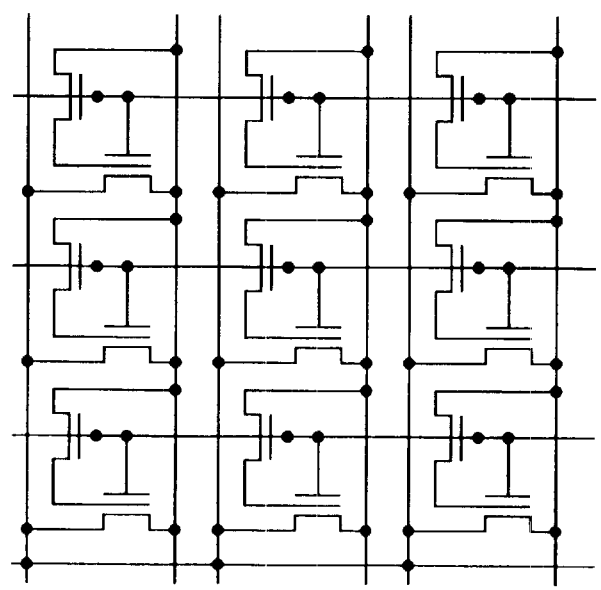
FIG. 38 is an equivalent circuit diagram of the memory mat of the semiconductor memory device as the seventeenth embodiment.
Figure 39:
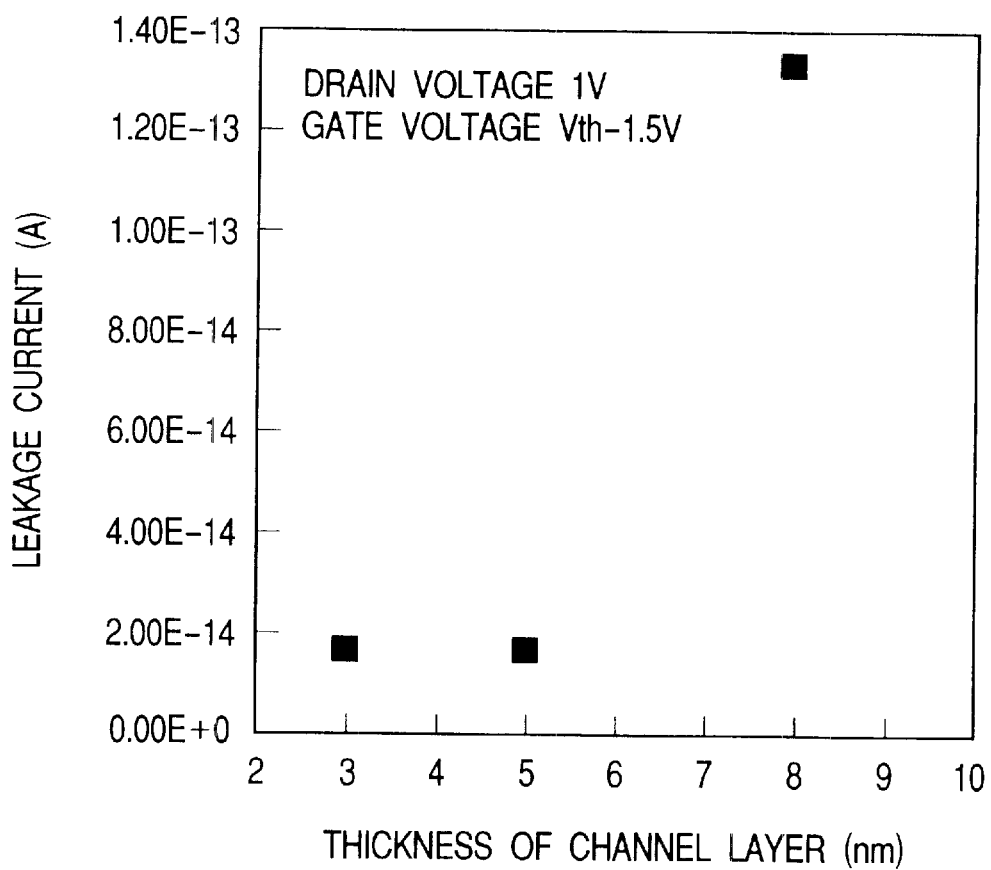
FIG. 39 is a graphic representation showing the dependencies of leak currents on channel film thicknesses in the experimental transistors studied prior to creation of this invention.

FIG. 37 shows a semiconductor memory device practiced as the seventeenth embodiment of the invention. The unit structure of a memory element of this device is the same as that in FIG. 1 of the fourth embodiment. Whereas the fourth embodiment had the write data line separated from the read data line, the seventeenth embodiment connects the two lines. Depicted in FIG. 37 is part of a cell array having unit structures arranged in a three-row three-column matrix. Portions 282 and 283 enclosed by broken lines represent a unit structure each. Although only a few elements are shown here for purpose of simplification and illustration, numerous elements are provided in practice to make up a memory array component (called a memory mat). Unlike the configurations in FIGS. 4A, 4B and 5 of the fourth embodiment, the seventeenth embodiment has the drain 285 of each read transistor shared by memory elements belonging to the same column, and uses a diffusion layer for wiring. As such, the seventeenth embodiment takes up less cell area than other configurations. Each source 284 is connected via the diffusion layer to the memory elements that belong to the same column. A control electrode 290 shared by a write transistor and a read transistor is connected to the memory elements belonging to the same row. The drain 286 of each write transistor is connected to the memory elements belonging to the same column, and is further connected via a contact hole 287 to the drain 285 of a read transistor at a memory mat edge. In large-scale circuit integration arrangements, the diffusion layer wiring and polycrystal silicon wiring generally have such high resistance levels that they must be backed with metal wiring. By contrast, the seventeenth embodiment need only prepare metal wiring acting both as read data lines and as write data lines. This translates into a limited wiring area. At another edge of the memory mat, contact holes 288 are provided corresponding to sources 284 of read transistors and are connected to a metal source line 289. Because the contact holes 287 and 288 corresponding to the source and drain regions of the same element are provided at a different edge of the memory mat, enough room is provided to accommodate the contact holes while the column-to-column spacing need not be prolonged. An equivalent circuit of this structure is shown in FIG. 38. Alternatively, the source region of each read transistor may be shared by adjacent rows to reduce the area. This arrangement produces a laterally symmetrical mirrored arrangement of memory elements.

Furthermore, the drain region of each read transistor may also be shared by adjacent columns. This constitutes a minimal structure in which it is impossible to perform a write and a read operation simultaneously to and from adjacent elements that belong to the same row. In such a case, the operations need to be carried out separately on every second column. The seventeenth embodiment is designed to have the data lines and control electrodes shared between the write and read transistors and thus takes up a very small area.

It should be noted that the seventeenth embodiment has less voltage and threshold value margins necessary for stable performance than other embodiments wherein the components are separated. A top priority of the seventeenth embodiment is to reduce the device area, with one contact hole 287 shared by a plurality of memory elements. Alternatively, a contact hole may be furnished to each memory element or to each group of a small number of memory elements. Although this alternative requires providing an extended wiring pitch between data lines or between word lines, the arrangement constitutes a memory device fit for high-speed performance because of reduced high-resistance wiring portions.

As described and according to the invention, there are provided semiconductor elements subject to a threshold voltage controlling method other than those based on low leak currents or on the implantation of impurities. Such semiconductor elements are used to form semiconductor memory elements that are suitable for use in scaled-down structures and are conducive to high-speed write operations thanks to a sufficiently prolonged refresh cycle. These semiconductor memory elements are in turn used to constitute a suitable semiconductor memory device.

As many apparently different embodiments of this invention may be made without departing from the spirit and scope thereof, it is to be understood that the invention is not limited to the specific embodiments thereof except as defined in the appended claims.

What is claimed is:

1. A semiconductor memory element comprising:
   a read transistor structure made of a source region, a drain region, a semiconductor region for interconnecting said source region and said drain region, and a control electrode for controlling conductance of said semiconductor region;
   a charge accumulating region located near said semiconductor region for interconnecting said source region and said drain region; and
   a write transistor structure for either electrically charging or electrically discharging said charge accumulating region;
   wherein an amount of electrical charges stored in said charge accumulating region changes conductance between said source region and said drain region in said read transistor structure, the conductance change being utilized for data storage; and
   wherein a channel of said write transistor structure is made of a semiconductor film 5 nm at most in average thickness.

2. A semiconductor memory element according to claim 1, wherein said channel of said write transistor structure is constituted by polycrystal silicon.

3. A semiconductor memory element according to claim 1, wherein a distance between a channel of said write transistor structure and said charge accumulating region is 10 nm at most.

4. A semiconductor memory element according to claim 1, wherein a distance between a channel of said write transistor structure and said charge accumulating region is 7 nm at most.

5. A semiconductor memory element according to claim 1, wherein a gate insulating film of said write transistor structure is 15 nm thick at most.

6. A semiconductor memory element according to claim 1, wherein a gate insulating film of said write transistor structure is 10 nm thick at most.

7. A semiconductor memory element according to claim 1, wherein said source region and said drain region of said write transistor are constituted by polycrystal silicon.

8. A semiconductor memory element according to claim 1, wherein a channel of said write transistor structure is provided so as to cause currents moving through the structure to flow in substantially perpendicular relation to a substrate.

9. A semiconductor memory element according to claim 8, wherein said channel of said write transistor structure has a shape similar to a side surface of any one of a cylinder, a square pole and an intermediate form therebetween, wherein said any one of said cylinder, said square pole and said intermediate form is furnished in a substantially vertical direction.

10. A semiconductor memory element according to claim 8, wherein said channel of said write transistor structure is located on an inner side of a hole provided in a substantially vertical direction.

11. A semiconductor memory element according to claim 10, wherein at least part of a control electrode of said write transistor structure is located on an inner side of a region surrounded by said channel.

12. A semiconductor memory element according to claim 1, wherein said control electrode of said read transistor structure doubles as a control electrode of said write transistor structure.

13. A semiconductor memory device comprising a plurality of semiconductor memory elements according to claim 12, wherein said drain regions of said read transistor structures in said plurality of semiconductor memory elements are interconnected;
    wherein drain regions of said write transistor structures in said plurality of semiconductor memory elements are interconnected, and so are said control electrodes of said write transistor structures;
    wherein the connected drain regions of said read transistor structures are arranged in a substantially parallel relation with the connected drain regions of said write transistor structures; and
    wherein the connected drain regions of said read transistor structures are arranged in a substantially perpendicular relation to the connected control electrodes of said write transistors.

14. A semiconductor memory element according to claim 1, wherein said control electrode of said read transistor structure and a drain region of said write transistor structure are provided in an integral fashion.

15. A semiconductor memory device comprising a plurality of semiconductor memory elements according to claim 14, wherein said drain regions of said read transistor structures in said plurality of semiconductor memory elements are interconnected;
    wherein said drain regions of said write transistor structures in said plurality of semiconductor memory elements are interconnected, and so are control electrodes of said write transistor structures;
    wherein the connected drain regions of said read transistor structures are arranged in a substantially parallel relation with the connected control electrodes of said write transistor structures; and
    wherein the connected drain regions of said read transistor structures are arranged in a substantially perpendicular relation to the connected drain regions of said write transistors.

16. A semiconductor memory device comprising a plurality of semiconductor memory elements according to claim 1, wherein, at least between two adjacent semiconductor memory elements, said source regions and said drain regions of said read transistor structures are interconnected.

17. A semiconductor memory device according to claim 16, wherein said source regions and said drain regions of said read transistors are connected by an impurity diffusion layer.

18. A semiconductor memory element according to claim 1, wherein said read transistor structure is connected via another transistor structure to a read data line.

19. A semiconductor memory device either comprising a plurality of semiconductor memory elements claimed in claim 1;
    wherein a difference between potentials fed to said semiconductor memory elements in said semiconductor memory device is 5 V at most.

20. A semiconductor memory device either comprising a plurality of semiconductor memory elements claimed in claim 1;
    wherein a potential fed to write word line connected to said write transistor structure is plus or minus 5 V at most and preferably plus or minus 3 V at most.

21. A semiconductor memory device either comprising a plurality of semiconductor memory elements claimed in claim 1;
    wherein said semiconductor memory device is refreshed only in one of two cases: when a data processor including the device is either turned on or turned off, or when said data processor is both turned on and turned off.

22. A semiconductor memory device either comprising a plurality of semiconductor memory elements claimed in claim 1;
    wherein, in a write operation to said semiconductor memory device, application of a write pulse is not followed by verification of written data.

23. A semiconductor memory element comprising:
    a substrate;
    a read transistor structure having a source region and a drain region formed in said substrate, and a channel region for interconnecting said source region and said drain region;
    a charge accumulating region located near said channel region;
    a write transistor structure for either electrically charging or electrically discharging said charge accumulating region;
    wherein at least part of a channel of said write transistor is formed by a semiconductor film deposited on a surface intersecting a principal plane of said substrate; and
    wherein said semiconductor film is 5 nm at most in average thickness and deposited on a side of a convex formation on said principal plane of said substrate.

24. A semiconductor memory element comprising:
    a substrate;
    a read transistor structure having a source region and a drain region formed in said substrate, and a channel region for interconnecting said source region and said drain region;
    a charge accumulating region located near said channel region;
    a write transistor structure for either electrically charging or electrically discharging said charge accumulating region;

wherein at least part of a channel of said write transistor is formed by a semiconductor film deposited on a surface intersecting a principal plane of said substrate; and wherein either a source region or a drain region of said write transistor structure is formed by a film deposited on said principal plane of said substrate.

25. A semiconductor memory element comprising:

a read transistor structure made of a source region, a drain region, a semiconductor region for interconnecting said source region and said drain region, and a control electrode for controlling conductance of said semiconductor region between said source region and said drain region;

a charge accumulating region located near said semiconductor region for interconnecting said source region and said drain region;

a write transistor structure for either electrically charging or electrically discharging said charge accumulating region;

wherein an amount of electrical charges stored in said charge accumulating region changes conductance between said source region and said drain region in said read transistor structure, the conductance change being utilized for data storage;

wherein a distance between a channel of said read transistor structure and said charge accumulating region is 10 nm at most and preferably 7 nm at most; and wherein a gate insulating film of said write transistor structure is 15 nm thick at most.

26. A semiconductor memory element comprising:

a read transistor structure made of a source region, a drain region, a semiconductor region for interconnecting said source region and said drain region, and a control electrode for controlling conductance of said semiconductor region between said source region and said drain region;

a charge accumulating region located near said semiconductor region for interconnecting said source region and said drain region;

a write transistor structure for either electrically charging or electrically discharging said charge accumulating region;

wherein an amount of electrical charges stored in said charge accumulating region changes conductance between said source region and said drain region in said read transistor structure, the conductance change being utilized for data storage;

wherein a distance between a channel of said read transistor structure and said charge accumulating region is 10 nm at most and preferably 7 nm at most; and wherein said source region and said drain region of said write transistor are constituted by polycrystal silicon.

27. A semiconductor memory element comprising:

a read transistor structure made of a source region, a drain region, a semiconductor region for interconnecting said source region and said drain region, and a control electrode for controlling conductance of said semiconductor region between said source region and said drain region;

a charge accumulating region located near said semiconductor region for interconnecting said source region and said drain region;

a write transistor structure for either electrically charging or electrically discharging said charge accumulating region;

wherein an amount of electrical charges stored in said charge accumulating region changes conductance between said source region and said drain region in said read transistor structure, the conductance change being utilized for data storage;

wherein a distance between a channel of said read transistor structure and said charge accumulating region is 10 nm at most and preferably 7 nm at most; and wherein a channel of said write transistor structure is provided so as to cause currents moving through the structure to flow in substantially perpendicular relation to a substrate.

28. A semiconductor memory element comprising:

a read transistor structure made of a source region, a drain region, a semiconductor region for interconnecting said source region and said drain region, and a control electrode for controlling conductance of said semiconductor region between said source region and said drain region;

a charge accumulating region located near said semiconductor region for interconnecting said source region and said drain region;

a write transistor structure for either electrically charging or electrically discharging said charge accumulating region;

wherein an amount of electrical charges stored in said charge accumulating region changes conductance between said source region and said drain region in said read transistor structure, the conductance change being utilized for data storage;

wherein a distance between a channel of said read transistor structure and said charge accumulating region is 10 nm at most and preferably 7 nm at most; and wherein a gate insulating film of said write transistor structure is 10 nm thick at most.

* * * * *